(12) United States Patent
Nojima et al.

(10) Patent No.: US 11,877,078 B2
(45) Date of Patent: *Jan. 16, 2024

(54) SOLID-STATE IMAGING DEVICE, IMAGING APPARATUS, AND METHOD OF MANUFACTURING SOLID-STATE IMAGING DEVICE

(71) Applicant: SONY SEMICONDUCTOR SOLUTIONS CORPORATION, Kanagawa (JP)

(72) Inventors: Kenta Nojima, Kumamoto (JP); Kenju Nishikido, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/152,855

(22) Filed: Jan. 11, 2023

(65) Prior Publication Data

US 2023/0164454 A1 May 25, 2023

Related U.S. Application Data

(63) Continuation of application No. 17/028,269, filed on Sep. 22, 2020, now Pat. No. 11,575,848, which is a (Continued)

(30) Foreign Application Priority Data

Sep. 14, 2016 (JP) .................. 2016-179584

(51) Int. Cl.
*H04N 25/70* (2023.01)
*H01L 27/146* (2006.01)
*H04N 25/76* (2023.01)

(52) U.S. Cl.
CPC ....... *H04N 25/70* (2023.01); *H01L 27/14605* (2013.01); *H01L 27/14607* (2013.01);
(Continued)

(58) Field of Classification Search
CPC ......... H01L 27/14627; H01L 27/14605; H01L 27/14607; H01L 27/14621;
(Continued)

(56) References Cited

U.S. PATENT DOCUMENTS 8,866,249 B2 10/2014 Hashimoto
10,812,747 B2 * 10/2020 Nojima ............ H01L 27/14685
(Continued)

FOREIGN PATENT DOCUMENTS

CN 1574371 A 2/2005
CN 101290942 A 10/2008
(Continued)

OTHER PUBLICATIONS

International Search Report and Written Opinion of PCT Application No. PCT/JP2017/023161, dated Sep. 12, 2017, 10 pages of English Translation and 08 pages of ISRWO.
(Continued)

*Primary Examiner* — Abdelaaziz Tissire
(74) *Attorney, Agent, or Firm* — CHIP LAW GROUP

(57) ABSTRACT

The deterioration of light condensing characteristics of an overall solid-state imaging device resulting from providing in-layer lenses is suppressed while preventing the deterioration of device characteristics of the solid-state imaging device and reduction of yield. A solid-state imaging device including: a semiconductor substrate on which a plurality of photoelectric conversion devices are arranged in an imaging device region in a two-dimensional array; and a stacked body formed by stacking a plurality of layers on the semiconductor substrate, wherein the stacked body includes an
(Continued)

in-layer lens layer that has in-layer lenses each provided at a position corresponding to each of the photoelectric conversion devices; a planarization layer that is stacked on the in-layer lens layer and that has a generally planarized surface; and an on-chip lens layer that is an upper layer than the planarization layer and that has on-chip lenses each provided at a position corresponding to each of the photoelectric conversion devices, and the in-layer lens layer has a plurality of structures at a height generally equal to a height of the in-layer lenses, the plurality of structures being provided on an outside of the imaging device region.

10 Claims, 17 Drawing Sheets

Related U.S. Application Data continuation of application No. 16/325,421, filed as application No. PCT/JP2017/023161 on Jun. 23, 2017, now Pat. No. 10,812,747.

(52) U.S. Cl.
CPC .. *H01L 27/14621* (2013.01); *H01L 27/14623* (2013.01); *H01L 27/14627* (2013.01); *H01L 27/14685* (2013.01); *H04N 25/76* (2023.01); *H01L 27/1464* (2013.01); *H01L 27/14643* (2013.01)

(58) Field of Classification Search
CPC ......... H01L 27/14623; H01L 27/14685; H01L 27/1464; H01L 27/14643; H04N 5/369; H04N 5/374
See application file for complete search history.

(56) References Cited

U.S. PATENT DOCUMENTS

| | | | | |
|---|---|---|---|---|
| 11,575,848 | B2* | 2/2023 | Nojima | H01L 27/14685 |
| 2004/0238908 | A1* | 12/2004 | Hashimoto | H01L 31/02327 |
| | | | | 257/432 |
| 2006/0038209 | A1 | 2/2006 | Hashimoto | |
| 2006/0043261 | A1* | 3/2006 | Matsuda | H01L 27/14627 |
| | | | | 250/208.1 |
| 2008/0074520 | A1 | 3/2008 | Matsuda et al. | |
| 2008/0135964 | A1 | 6/2008 | Hashimoto | |
| 2009/0224347 | A1* | 9/2009 | Kim | H01L 27/14625 |
| | | | | 257/E31.127 |
| 2009/0251573 | A1* | 10/2009 | Toyoda | H01L 27/14627 |
| | | | | 438/70 |
| 2010/0155869 | A1* | 6/2010 | Komori | H01L 27/14618 |
| | | | | 257/E31.127 |
| 2010/0187648 | A1 | 7/2010 | Hashimoto | |
| 2010/0284202 | A1 | 11/2010 | Pan et al. | |
| 2012/0199928 | A1* | 8/2012 | Sawada | H01L 27/14687 |
| | | | | 257/E31.127 |
| 2012/0306037 | A1 | 12/2012 | Hashimoto | |
| 2013/0001724 | A1* | 1/2013 | Masuda | H01L 27/14629 |
| | | | | 257/E31.127 |
| 2015/0035104 | A1* | 2/2015 | Horikoshi | H01L 27/14685 |
| | | | | 438/69 |
| 2015/0109501 | A1* | 4/2015 | Sekine | H01L 27/14627 |
| | | | | 438/69 |
| 2016/0079302 | A1* | 3/2016 | Ogawa | H01L 27/14687 |
| | | | | 438/69 |
| 2018/0006071 | A1* | 1/2018 | Kato | H01L 27/14625 |
| 2018/0358396 | A1* | 12/2018 | Huang | H01L 27/14627 |

FOREIGN PATENT DOCUMENTS

| | | |
|---|---|---|
| CN | 101707203 A | 5/2010 |
| JP | 2005-012189 A | 1/2005 |
| JP | 2006-093676 A | 4/2006 |
| JP | 2006-128371 A | 5/2006 |
| JP | 2009-295739 A | 12/2009 |
| JP | 2012-252259 A | 12/2012 |
| JP | 2015-029011 A | 2/2015 |

OTHER PUBLICATIONS

International Preliminary Report on Patentability of PCT Application No. PCT/JP2017/023161, dated Mar. 28, 2019, 10 pages of English Translation and 05 pages of IPRP.
Non-Final Office Action for U.S. Appl. No. 16/325,421, dated Feb. 20, 2020, 11 pages.
Notice of Allowance for U.S. Appl. No. 16/325,421, dated Jun. 18, 2020, 09 pages.
Non-Final Office Action for U.S. Appl. No. 17/028,269, dated Feb. 3, 2022, 22 pages.
Final Office Action for U.S. Appl. No. 17/028,269, dated Jun. 27, 2022, 22 pages.
Advisory Action for U.S. Appl. No. 17/028,269, dated Sep. 8, 2022, 03 pages.
Notice of Allowance for U.S. Appl. No. 17/028,269, dated Oct. 6, 2022, 09 pages.

* cited by examiner

SOLID-STATE IMAGING DEVICE, IMAGING APPARATUS, AND METHOD OF MANUFACTURING SOLID-STATE IMAGING DEVICE

CROSS REFERENCE TO RELATED APPLICATIONS

This application is a continuous application of U.S. patent application Ser. No. 17/028,269, filed on Sep. 22, 2020, which is a continuation application of a U.S. patent application Ser. No. 16/325,421, filed on Feb. 14, 2019, now U.S. Pat. No. 10,812,747, which is a U.S. National Phase of International Patent Application No. PCT/JP2017/023161 filed on Jun. 23, 2017, which claims priority benefit of Japanese Patent Application No. JP 2016-179584 filed in the Japan Patent Office on Sep. 14, 2016. Each of the above-referenced applications is hereby incorporated herein by reference in its entirety.

TECHNICAL FIELD

The present invention relates to a solid-state imaging device, an imaging apparatus, and a method of manufacturing a solid-state imaging device.

BACKGROUND ART

In recent years, miniaturization and increase in the number of pixels of solid-state imaging devices mounted in digital cameras and the like have been underway as pixels are made fine. Owing to this, the tendency to reduce the area of a photoelectric conversion section in each pixel has been accelerated and the total amount of light incident on one photoelectric conversion section has been reduced more greatly than before. Thus, it is essential to enabling the light to be incident on the photoelectric conversion section to be introduced to the photoelectric conversion section without waste for the purpose of maintaining and improving the sensitivity of an imaging device.

To improve light condensing efficiency for efficiently introducing the light incident on each pixel to the photoelectric conversion element, therefore, a multi-lens structure in which in-layer lenses (also referred to as "inner lenses") are formed on a lower layer of past provided on-chip lenses (between the layer of the on-chip lenses and a semiconductor substrate having photodiodes) has been in the mainstream as a structure of the solid-state imaging device (refer to, for example, PTL 1).

The in-layer lens is formed with a transparent material having a higher refractive index value than that of a peripheral material. Providing the in-layer lens produces not only an effect of improving the sensitivity but also an effect of reducing stray light that causes flare as a result of condensing light that has been incident on the periphery of a light shielding section formed on the surface of one photoelectric conversion section to neighborhoods of the center of the photoelectric conversion section by the in-layer lens.

CITATION LIST

Patent Literature

[PTL 1]
Japanese Patent Laid-Open No. 2015-029011

SUMMARY

Technical Problem

To stack color filters and on-chip lenses similar to those provided past on an upper layer than the in-layer lenses, a planarization film is provided immediately on the in-layer lenses to provide a planar surface and the color filters and the on-chip lenses are then stacked on the surface. Specifically, an oxide film is stacked on the in-layer lenses at a thickness to such an extent that a stacking height of the oxide film relative to a base portion of each in-layer lens is larger than a height of the in-layer lens, and a planarization process is performed to subject a surface of this oxide film to polishing and grinding by an approach such as chemical mechanical polishing (CMP) and to eliminate irregularities on the surface of the oxide film.

However, it is difficult to completely eliminate a step on the surface of the planarization film near a boundary between an imaging device region where the in-layer lenses are present and regions (including, for example, a peripheral circuit region and a scribe region) where the in-layer lenses are not present, and a downward slope step remains from within the imaging device region to the regions other than the imaging device region across the boundary of the imaging device region in the ordinary planarization process.

This downward slope step possibly extends into the imaging device region where the photoelectric conversion sections are present. Owing to this, on-chip lenses near the boundary of the imaging device are formed on the downward slope step, and on-chip lenses in a central portion of the imaging device region are formed on sites without the downward slope step. As a result, a variation occurs in light condensing characteristics among the on-chip lenses formed within the same imaging device region. In other words, the on-chip lenses are normally designed on the premise that there is no such a step, and a focus of incident light passing through each of the on-chip lenses provided on the slopes deviates from a designed focus, possibly resulting in deterioration of chip characteristics.

Needless to say, there is a possibility that the step can be mitigated by increasing a stacking amount of the oxide film to increase the thickness of the oxide film and increasing a thickness by which the oxide film is polished and ground in the planarization process. However, increasing the thickness of the oxide film leads to increases in a variation in the thickness of the oxide film and in a polishing amount, possibly resulting in a greater variation in the light condensing characteristics among the chips. Furthermore, increasing the stacking thickness of the oxide film leads to increases in polishing and grinding amounts and an increase in film formation dust generated during a series of the planarization process to increase deposits in a film forming chamber, and the falling and adhesion of the film formation dust onto a surface of the imaging device from an inner wall of an apparatus, possibly resulting in reduction of yield. Furthermore, performing polishing on the imaging device with the film formation dust falling and adhering onto the surface of the imaging devices causes scratches. Moreover, increasing the polishing and grinding amounts by increasing the stacking thickness of the oxide film disadvantageously causes increases in processing time and load on the apparatus.

The present technology has been achieved in the light of the problems above, and an object of the present technology is to suppress the deterioration of light condensing characteristics of an overall device resulting from providing in-layer lenses while preventing the deterioration of device characteristics of the solid-state imaging device and reduction of yield.

Solution to Problem

One aspect of the present technology is a solid-state imaging device including: a semiconductor substrate on which a plurality of photoelectric conversion devices are arranged in an imaging device region in a two-dimensional array; and a stacked body formed by stacking a plurality of layers on the semiconductor substrate, in which the stacked body includes an in-layer lens layer that has in-layer lenses each provided at a position corresponding to each of the photoelectric conversion devices; a planarization layer that is stacked on the in-layer lens layer and that has a generally planarized surface; and an on-chip lens layer that has on-chip lenses each provided at a position corresponding to each of the photoelectric conversion devices, and the in-layer lens layer has a plurality of structures at a height generally equal to a height of the in-layer lenses, the plurality of structures being provided on an outside of the imaging device region.

Furthermore, one aspect of the present technology is an imaging apparatus including: a solid-state imaging device; and a signal processing circuit that processes a signal from the solid-state imaging device, in which the solid-state imaging device includes a semiconductor substrate on which a plurality of photoelectric conversion devices are arranged in an imaging device region in a two-dimensional array; and a stacked body formed by stacking a plurality of layers on the semiconductor substrate, the stacked body includes an in-layer lens layer that has in-layer lenses each provided at a position corresponding to each of the photoelectric conversion devices; a planarization layer that is stacked on the in-layer lens layer and that has a generally planarized surface; and an on-chip lens layer that is an upper layer than the planarization layer and that has on-chip lenses each provided at a position corresponding to each of the photoelectric conversion devices, and the in-layer lens layer has a plurality of structures at a height generally equal to a height of the in-layer lenses, the plurality of structures being provided on an outside of the imaging device region.

Moreover, one aspect of the present technology is a method of manufacturing a solid-state imaging device, including: a first step of forming a plurality of photoelectric conversion devices in an imaging device region of a semiconductor substrate in a two-dimensional array; and a second step of forming a plurality of layers by stacking on another on the semiconductor substrate, in which the second step includes: a step of forming an in-layer lens layer that has in-layer lenses each at a position corresponding to each of the photoelectric conversion devices; a step of forming a planarization layer having a generally planarized surface on the in-layer lens layer; and a step of forming an on-chip lens layer that is an upper layer than the planarization layer and that has on-chip lenses each at a position corresponding to each of the photoelectric conversion devices, and in the step of forming the in-layer lens layer, a plurality of structures at a height generally equal to a height of the in-layer lenses are formed on an outside of the imaging device region.

It is to be noted that the solid-state imaging device and the imaging apparatus described above include various kinds of aspects including implementation in a state of being incorporated into the other apparatus or system and implementation together with other methods. Furthermore, the method of manufacturing the solid-state imaging device described above can be implemented as part of the other methods or realized as a control program controlling a solid-state imaging device manufacturing apparatus or a solid-state imaging device manufacturing system equipped with means corresponding to the steps, a computer readable recording medium recording the control program, and the like.

Advantageous Effect of Invention

According to the present technology, in a solid-state imaging device, it is possible to suppress occurrence of a variation in light condensing characteristics among the on-chip lenses resulting from providing the in-layer lenses while preventing the deterioration of the device characteristics and the reduction of yield. The effects described in the present specification are given as an example only, and the effects are not limited to those described in the present specification and may include additional effects.

DESCRIPTION OF EMBODIMENTS

The present technology will be described in accordance with the following order.

(A) First embodiment:
(B) Second embodiment:
(C) Third embodiment:
(D) Example of application to endoscopic surgery system:
(E) Example of application to mobile body:

(A) First Embodiment

Figure 1:
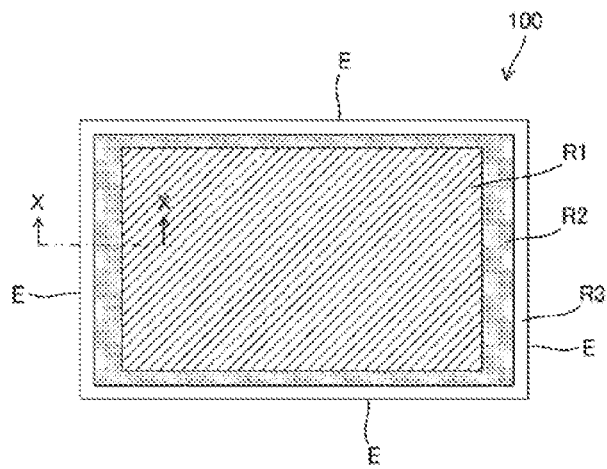
FIG. 1 is a view depicting a planar configuration of a solid-state imaging device according to a first embodiment.

FIG. 1 is a view depicting a planar configuration of a solid-state imaging device 100 according to the present embodiment. The solid-state imaging device 100 receives light incident from a subject, performs photoelectric conversion on the light, and outputs an electrical signal in response to an amount of the light.

It is to be noted that a type of the solid-state imaging device 100 is not limited to a specific type and may be a surface irradiation type or a back irradiation type. Furthermore, the solid-state imaging device 100 may be any of a complementary metal oxide semiconductor (CMOS), a charge coupled device (CCD), and other types. In a case of the surface irradiation type solid-state imaging device, an interconnection layer 20, to be described later, is formed between a semiconductor substrate 10 and an in-layer lens layer 40 to be described later. It is to be noted that the solid-state imaging device 100 will be described while taking a back irradiation type CMOS image sensor by way of example.

The solid-state imaging device 100 has an imaging device region R1, a peripheral circuit region R2, and a scribe region R3. Marks used for lithographic positioning and the like are provided in these regions as needed.

The imaging device region R1 is a region where photoelectric conversion devices are provided and is generally rectangular. The peripheral circuit region R2 is a region where peripheral circuits of the solid-state imaging device 100 are provided and which is provided into a frame shape in such a manner as to surround the imaging device region R1. The scribe region R3 is a site left in an edge portion of the solid-state imaging device 100 after a wafer on which a plurality of solid-state imaging devices 100 are simultaneously formed is cut into the solid-state imaging devices 100 by dicing at a time of dividing the wafer into the solid-state imaging devices 100, and is a region provided into a frame shape in such a manner as to surround the peripheral circuit region R2. While a test element group (TEG) region is often provided in the scribe region R3, the TEG region is cut and separated by scribing and does not, therefore, remain in the solid-state imaging device 100.

Figure 2:
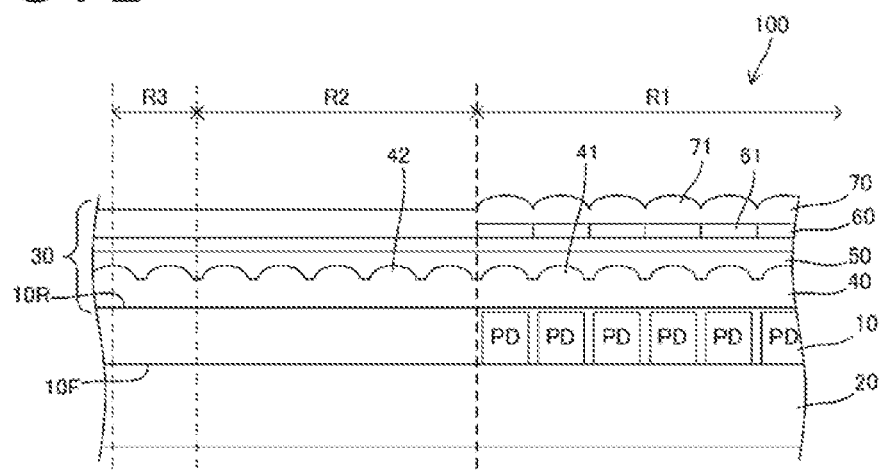
FIG. 2 is a view schematically depicting principal parts of a section taken along an X-X cross-section depicted in FIG. 1.

FIG. 2 is a view schematically depicting principal parts on a section taken along an X-X cross-section depicted in FIG. 1. The solid-state imaging device 100 has one or a plurality of layers formed on each of a front surface 10F and a rear surface 10R of the semiconductor substrate 10. These layers are formed by, for example, a chemical vapor deposition method, a physical vapor deposition method, a coating method such as a spin coating method, lithography, or adhesion of a supporting substrate, a peripheral circuit substrate manufactured separately, and the like.

In FIG. 2, the solid-state imaging device 100 has the interconnection layer 20 stacked on the front surface 10F of the semiconductor substrate 10, and a stacked body 30 stacked on the rear surface 10R of the semiconductor substrate 10. The stacked body 30 has an in-layer lens layer 40, a planarization layer 50, a color filter layer 60, and an on-chip lens layer 70 in an ascending order of distance to the semiconductor substrate 10. Other layers may be stacked between the layers (the in-layer lens layer 40, the planarization layer 50, the color filter layer 60, and the on-chip lens layer 70) of the stacked body 30.

A plurality of photodiodes PD serving as the photoelectric conversion devices are provided side by side within the imaging device region R along the rear surface 10R of the semiconductor substrate 10. Although not depicted in FIG. 2, pixel transistors (a transfer transistor, a reset transistor, an amplification transistor, a selection transistor) are also provided within the imaging device region R1 along the front surface 10F of the semiconductor substrate 10. Basically, the pixel transistors are provided in each pixel. It is noted, however, that in a case of a floating diffusion (FD) sharing scheme of sharing an FD among a plurality of pixels, the transfer transistor is provided in each pixel but the other pixel transistors are provided per FD.

The semiconductor substrate 10 is connected to a peripheral circuit via pixel driving lines and vertical signal lines that configure the interconnection layer 20 stacked on the front surface 10F of the semiconductor substrate 10. The peripheral circuits are configured with part of or all of a vertical driving section 122, an analog-digital conversion section 123 (AD conversion section 123), a reference signal generation section 124, a horizontal driving section 125, a communication/timing control section 126, and a signal processing section 127. The peripheral circuits are formed in the peripheral circuit region R2 provided on an outside of the imaging device region R1 and/or the peripheral circuit substrate adhering onto a rear surface of the interconnection layer 20.

Figure 3:
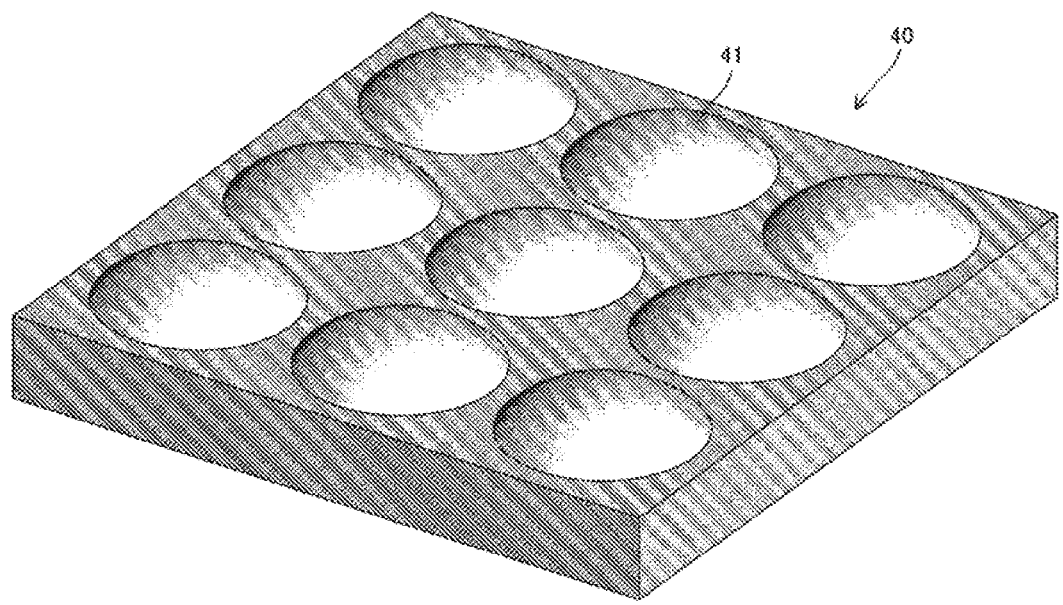
FIG. 3 is a view depicting a projection shape of in-layer lenses.

The in-layer lens layer 40 is stacked on the rear surface 10R of the semiconductor substrate 10 via an insulating layer and the like, which are not depicted. The in-layer lens layer 40 in the imaging device region R1 has a plurality of in-layer lenses 41. The in-layer lenses 41 are each provided at a position corresponding to a position of each of the photodiodes PD (in a position relationship in which each in-layer lens 41 overlaps each photodiode PD at least partially in a plan view of the solid-state imaging device 100). In other words, the in-layer lenses 41 are provided with regularity similar to that of an array of the photodiodes PD. Each of the in-layer lenses 41 has, for example, a shape of a convex lens protruding in a knoll shape from a surface thereof that does not face the semiconductor substrate 10 as depicted in FIG. 3. The in-layer lens layer 40 has a higher refractive index than 1.4 to 1.6 which is a refractive index of a material normally used as optical paths of the planarization layer 50 and the like stacked on the in-layer lens layer 40 and is preferably equal to or higher than 1.8.

The in-layer lens layer 40 in the regions (the peripheral circuit region R2 and the scribe region R3) other than the imaging device region R1 has a plurality of structures 42. The structures 42 are each provided at a position that does not correspond to the position of each of the photodiodes PD (position at which each structure 42 does not overlap each photodiode PD in the plan view of the solid-state imaging device 100), and provided at a height generally equal to that of the in-layer lenses 41. Each of the structures 42 is formed as a projection protruding toward a side that does not face the semiconductor substrate 10. A shape and a distribution of the structures 42 will be described later.

On the in-layer lens layer 40, the planarization layer 5 including a material having a lower refractive index than that of the in-layer lens layer 40 and having a generally planarized surface is stacked at a thickness enough to bury and cover an entire irregular shape of the in-layer lens layer 40 over entire surfaces of the imaging device region R1 and the regions other than the imaging device region R1. Since the planarization layer 50 is formed to be closely attached to the entire irregular surface of the in-layer lens layer 40, a layer boundary between the planarization layer 50 having the low refractive index and the in-layer lenses 41 having the high refractive index is formed between the in-layer lenses 41 and the planarization layer 50.

The color filter layer 60 is stacked on the planarization layer 50 in the imaging device region R1. In the color filter layer 60, a plurality of color filters 61 of three primary colors of red, green, and blue generally at the same height are provided at positions corresponding to the positions of the respective photodiodes PD (in a position relationship in which the color filters 61 overlap the photodiodes PD in the plan view of the solid-state imaging device 100) in, for example, a Bayer array. It is to be noted that the color filters 61 are not limited to those of the three primary colors of light and color filters of complementary colors may be used or a combination of the color filters and white color filters can be used as the color filters 61. An additional planarization layer may be stacked on the color filter layer 60 as needed.

The on-chip lens layer 70 is stacked on the color filter layer 60 in the imaging device region R1. The on-chip lens layer 70 has a plurality of on-chip lenses 71 each provided, for example, to correspond to the position of each of the color filters 61. The on-chip lenses 71 are formed using, for example, a high refractive index inorganic film such as a silicon nitride film (SiN film) and can be formed by an etch-back method. A refractive index of SiN is approximately 1.9.

Shapes and planar arrays of the in-layer lenses 41 and the structures 42 will next be described.

The in-layer lenses 41 have the knoll projection shape depicted in, for example, FIG. 3 as described above, and function as light condensing lenses that condense light incident through the upper layers including the on-chip lens layer 70 and the color filter layer 60 and that emit the condensed light toward the photodiodes PD. On the other hand, the structures 42 are projections at the same height as that of the in-layer lenses 41 and protruding in the same direction as that of the in-layer lenses 41 regardless of a shape and a light condensing function. In other words, the structures 42 may have a knoll-shape similar to that of the in-layer lenses 41 or may have a different shape from that of the in-layer lenses 41.

FIGS. 4 to 16 depict specific examples of the shape and an array of the structures 42.

Figure 4:
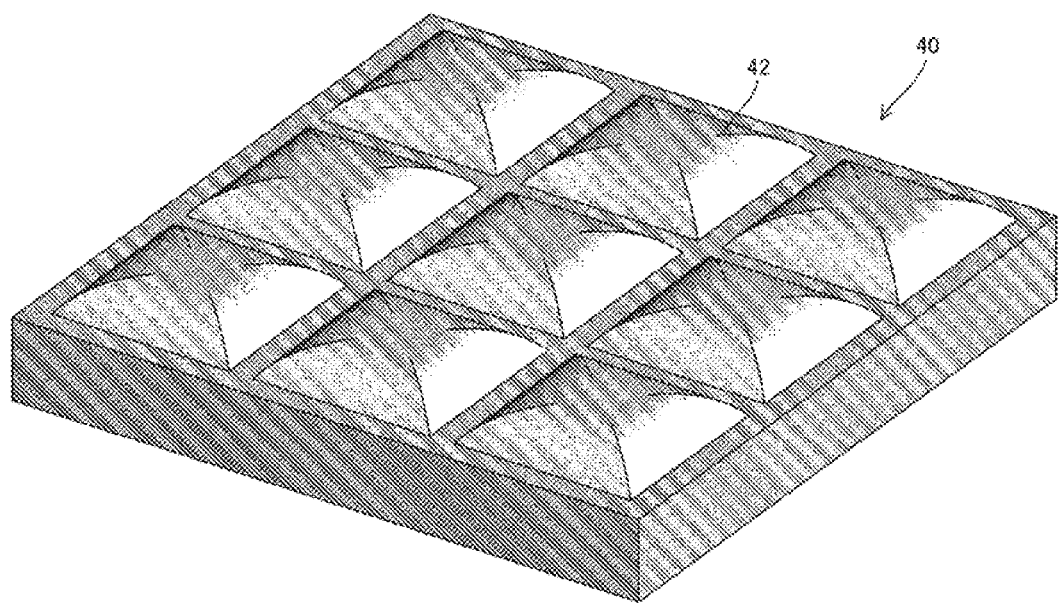
FIG. 4 is a view depicting an example of a projection shape of structures.

FIG. 4 is a view depicting an example of a projection shape of the structures 42. A base portion of each structure 42 depicted in FIG. 4 is generally rectangular and the structure 42 has a projection shape bulging from the base portion in a hilly fashion. In a case in which a length of a side of the base portion of this rectangular hilly projection is equal to a diameter of a base portion of the knoll-shaped projection, a coverage that indicates an occupation range of the structure 42 that is the rectangular hilly projection having the base portion in each pixel region is higher than that of the in-layer lens 41 that is the knoll-shaped projection having the base portion. Needless to say, in a case in which a shape of the pixel region is other than a rectangular shape, for example, a hexagonal shape (for example, in a case of adopting a honeycomb structure), the shape of the base portion is preferably a hexagonal hilly projection shape to be fit to the shape of the pixel region. It is to be noted that the shape of the base portion of each structure 42 is not necessarily uniform and a combination of the structures 42 having different base portion shapes may be arranged in an array as appropriate.

Figure 5:
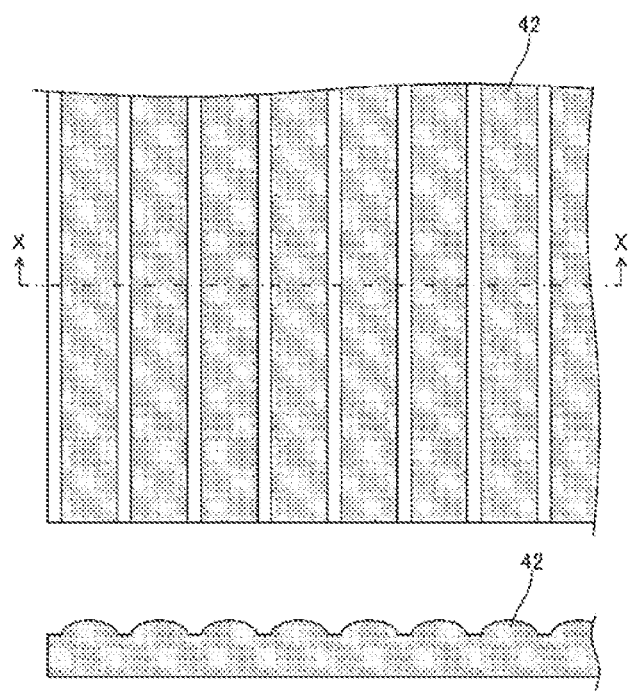
FIG. 5 is a view depicting another example of the projection shape of the structures.
Figure 6:
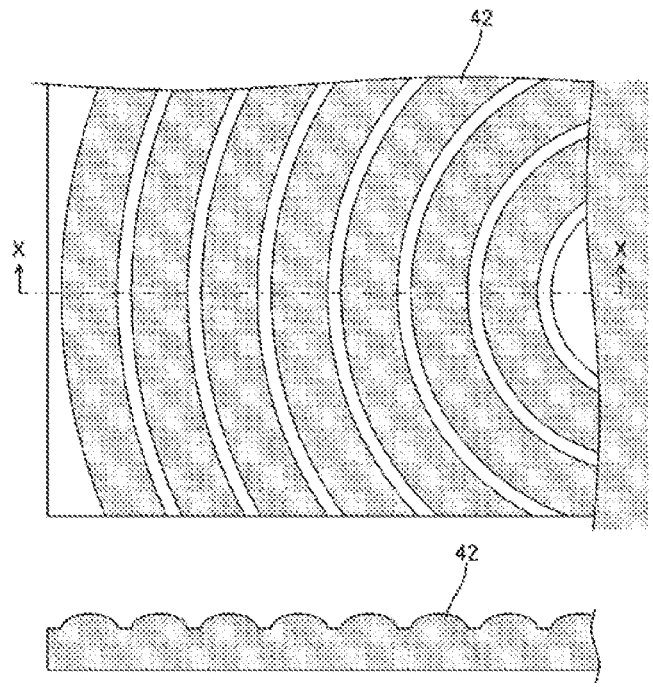
FIG. 6 is a view depicting another example of the projection shape of the structures.
Figure 7:
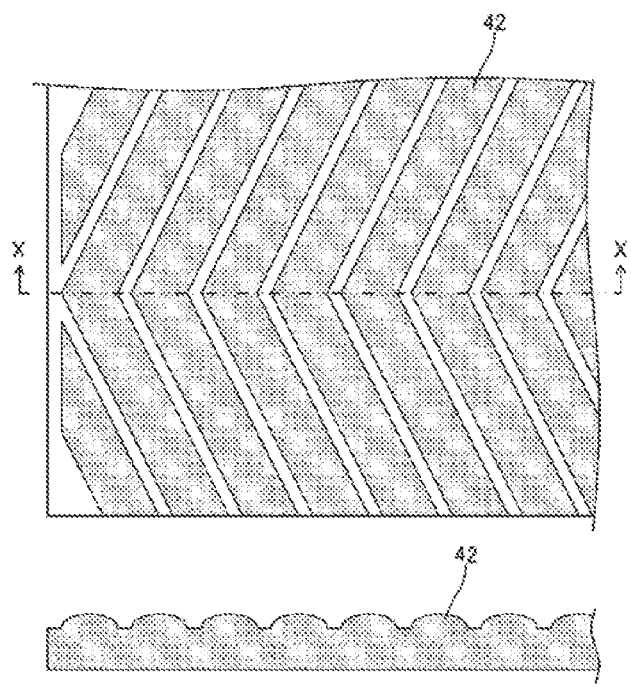
FIG. 7 is a view depicting another example of the projection shape of the structures.
Figure 8:
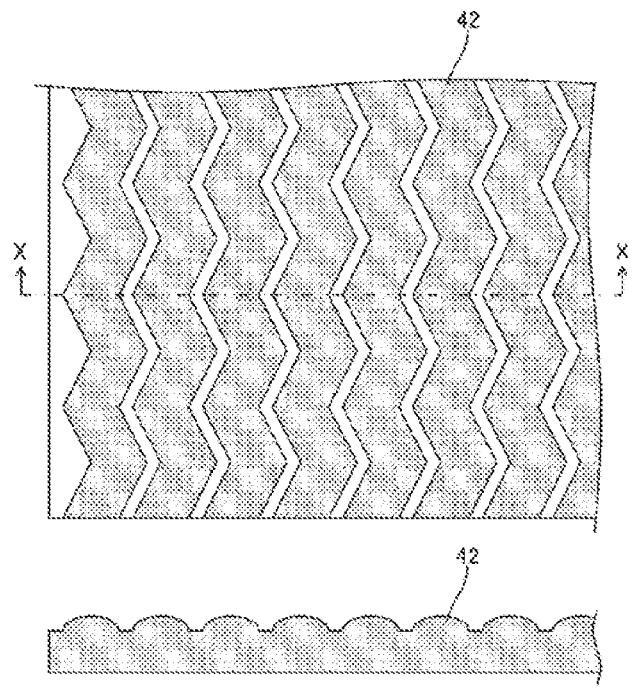
FIG. 8 is a view depicting another example of the projection shape of the structures.
Figure 9:
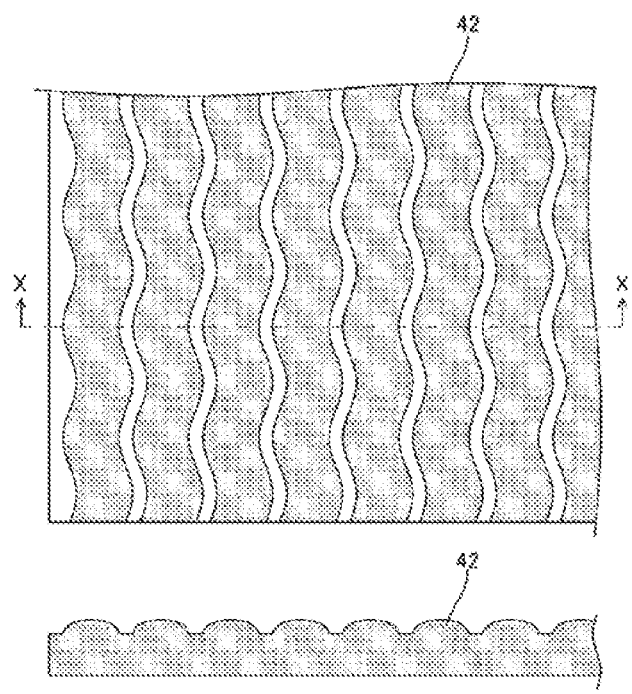
FIG. 9 is a view depicting another example of the projection shape of the structures.

FIG. 5 is a view depicting another example of the projection shape of the structures 41. Each of the structures 42 depicted in FIG. 5 is a linear projection having a semicylindrical projection provided on a wide and long linear base portion into a barrel shape. In other words, the structure 42 has a shape similar to a cylindrical lens. A coverage of the linear projection structure 42 is high, as compared with the structures 42 having circular or rectangular base portions. It is to be noted that the base portion shape of the linear projection structure 42 is not limited to the linear shape but may be, for example, a curved shape having a curvature halfway along the base portion or a crank-like shape having one or a plurality of bends halfway along the base portion depicted in FIGS. 6 to 9.

Figure 10:
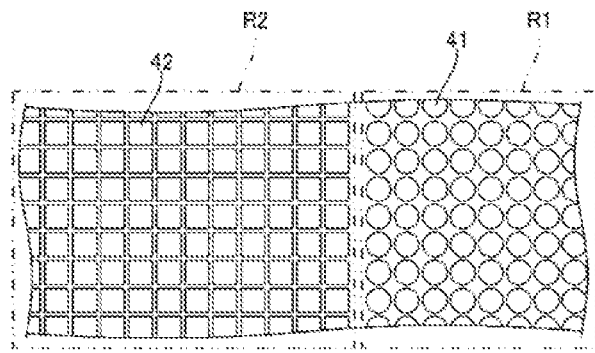
FIG. 10 is a view depicting an example of an array of the structures.
Figure 11:
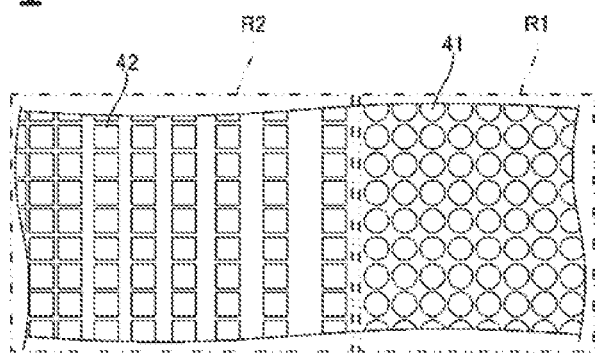
FIG. 11 is a view depicting another example of the array of the structures.
Figure 12:
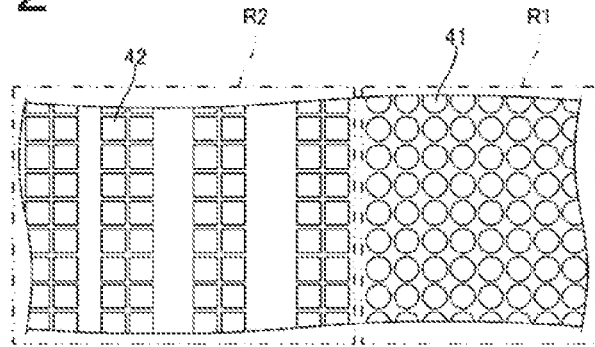
FIG. 12 is a view depicting another example of the array of the structures.
Figure 13:
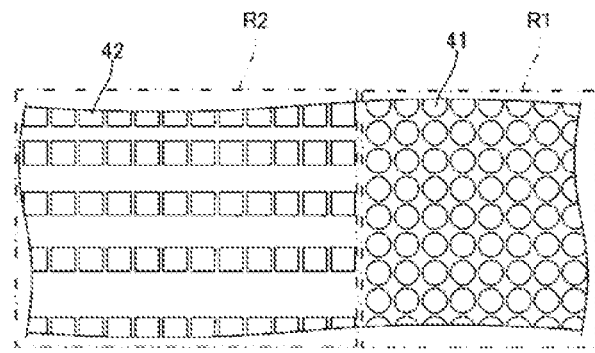
FIG. 13 is a view depicting another example of the array of the structures.
Figure 14:
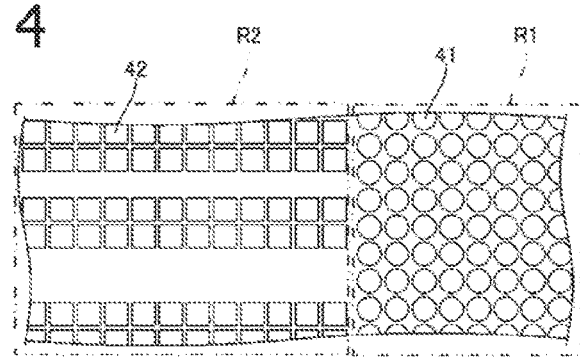
FIG. 14 is a view depicting another example of the array of the structures.
Figure 15:
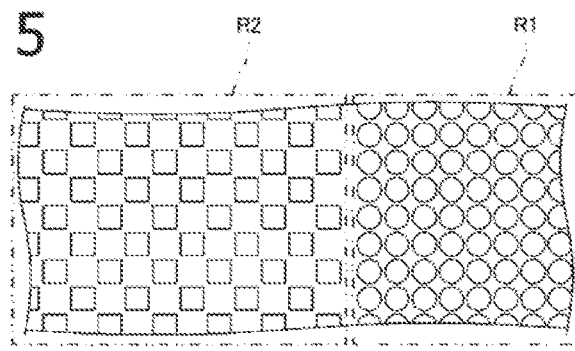
FIG. 15 is a view depicting another example of the array of the structures.
Figure 16:
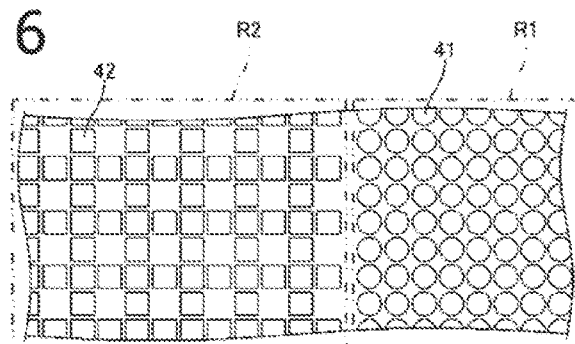
FIG. 16 is a view depicting another example of the array of the structures.

FIG. 10 is a view depicting an example of the array of the structures 42. The structures 42 depicted in FIG. 10 are provided at pitches generally equivalent to those of the in-layer lenses 41. Making the pitches of the structures 42 generally equivalent to those of the in-layer lenses 41 facilitates a design related to arrays of the in-layer lenses 41 and the structures 42. Furthermore, to improve planarity of the planarization layer 50 near a boundary between the imaging device region R1 and the other regions to be described in a method of manufacturing to be described later, it is preferable that a coverage of the in-layer lenses 41 of the in-layer lens layer 40 in the imaging device region R1 is close to those of the structures 42 of the in-layer lens layer 40 in the regions other than the imaging device region R1. However, a design for adjusting a size of each structure 42 is easier than a design for adjusting a distribution density of the structures 42, and a design for making the coverage of the in-layer lens 41 close to that of the structure 42 is easy to make.

FIGS. 11 to 16 are views depicting other examples of the array of the structures 42. The structures 42 depicted in FIGS. 11 to 16 are provided at pitches different from those of the in-layer lenses 41. Specifically, in the examples depicted in FIGS. 11 and 12, the array is such that formation pitches of the structures 42 gradually change in a transverse direction in FIGS. 11 and 12. In the examples depicted in FIGS. 13 and 14, the array is such that formation pitches of the structures 42 gradually change in a vertical direction in FIGS. 13 and 14. In the examples depicted in FIGS. 15 and 16, the array is such that the structures 42 provided at constant pitches as depicted in FIG. 10 are thinned out at regular intervals. Needless to say, the structures 42 may be provided in an array that is an appropriate combination of the arrays depicted in FIGS. 11 to 16. Changing array pitches of the structures 42 makes it possible to suppress occurrence of flare and the like. This is because in a case in which reflected light generated in the solid-state imaging device 100 reaches an outside of the imaging device region R where the in-layer lens layer 40 is provided and is reflected by the structures 42, it is difficult for the reflected light to possess regularity.

Figure 17:
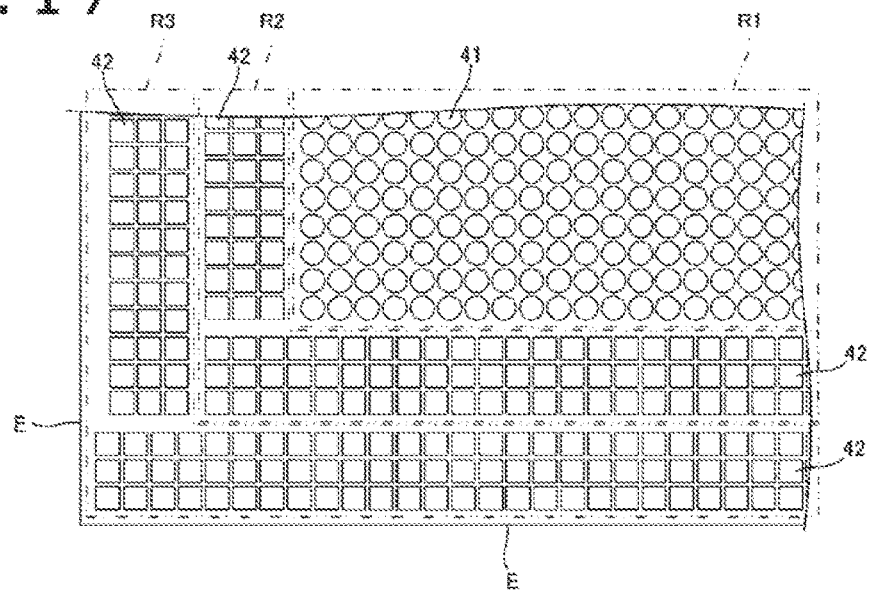
FIG. 17 is a view illustrating a formation range of the structures near an edge portion of the solid-state imaging device.

FIG. 17 is a view illustrating a formation range of the structures 42 near the edge portion of the solid-state imaging device 100. In the example depicted in FIG. 17, the structures 42 are provided in the in-layer lens layer 40 generally uniformly in almost entirety of the regions (the peripheral circuit region R2 and the scribe region R3) other than the imaging device region R1. It is to be noted that the shape of the structures 42 depicted in FIG. 17 is an example and that formation pitches and the numbers of the in-layer lenses 41 and the structures 42 are depicted schematically.

Furthermore, the projections as the in-layer lenses 41 and the structures 42 are formed generally entirely in the in-layer lens layer 40. Attention is paid in particular so that regions without the projections are not formed near the boundary between the imaging device region R1 and the other regions. The region without the projections is assumed, for example, as a region where no in-layer lenses 41 or structures 42 are provided in a range equal to or wider than 60 to 400 µm, preferably a region where no in-layer lenses 41 or structures 42 are provided in a range equal to or wider than 100 to 400 µm, more preferably a region where no in-layer lenses 41 or structures 42 are provided in a range equal to or wider than 200 to 400 µm, further more preferably a region where no in-layer lenses 41 or structures 42 are provided in a range equal to or wider than 300 to 400 µm. Not providing the regions without the projections enables realization of a structure that makes it difficult to form a downward slope step near the boundary between the imaging device region R1 and the other regions at a time of forming the planarization layer 50 as described in the method of manufacturing the solid-state imaging device 100 to be described later.

Furthermore, while the solid-state imaging device 100 has a scribed section formed by dicing along a scribe line in an edge portion E thereof, cross-sections of not only the in-layer lenses 41 but also the structures 42 do not appear on this scribed section. In other words, the in-layer lenses 41 and the structures 42 are not provided immediately on the scribed section. Owing to this, at a time of an inspection for determining whether the scribed section is a failure or no-failure, there is no probability that cross-sectional structures of the in-layer lenses 41 and the structures 42 appearing on the scribed section are erroneously determined as a failure.

Figure 18:
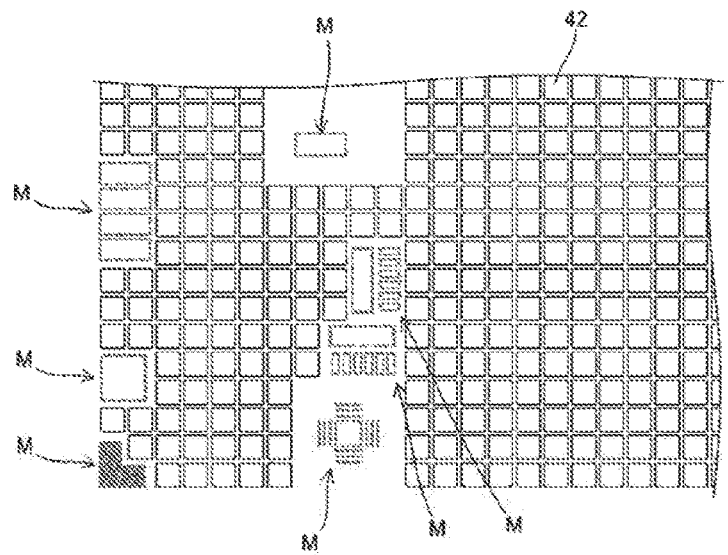
FIG. 18 is a view illustrating sites which are other than an imaging device region and where no structures are provided.

FIG. 18 is a view illustrating sites which are other than the imaging device region R1 and where no structures 42 are provided. The stacked body 30 contains sites provided with marks M on a lower layer than the in-layer lens layer 40. As depicted in FIG. 18, the structures 42 are not provided in the sites having the marks M provided on the lower layer. Examples of the positioning marks M include alignment marks used at a time of forming color filters, alignment marks used at a time of forming on-chip lenses, and an input/output pad formed on the interconnection layer 20. A through-hole that penetrates the stacked body 30 and the semiconductor substrate 10 and that communicate with the stacked body 30 and the semiconductor substrate 10 reaches the input/output pad, and an inspection such as an operation check of the peripheral circuits is conducted by inserting a probe into this through-hole to bring the probe into contact with the pad. Not providing the structures 42 in the sites where the positioning marks M are provided can prevent the structures 42 from disturbing detection of the positioning marks M in a process of performing layer forming and the like while performing positioning of upper and lower layers of the in-layer lens layer 40 after forming the in-layer lens layer 40.

Figure 19:
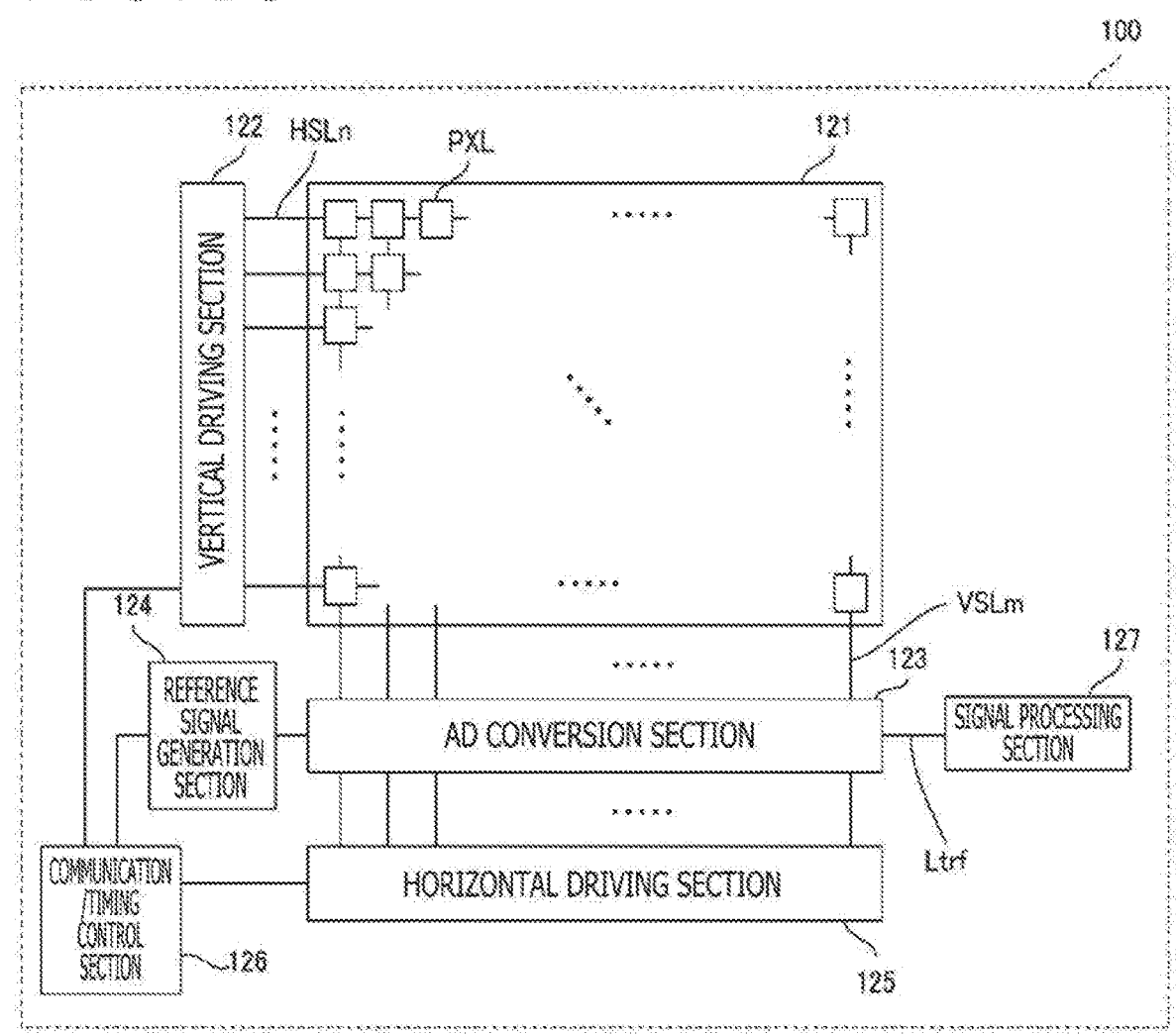
FIG. 19 is a block diagram depicting an electrical configuration of the solid-state imaging device.

FIG. 19 is a block diagram depicting an electrical configuration of the solid-state imaging device 100. It is to be noted that a CMOS image sensor that is a type of X-Y address type solid-state imaging apparatus will be described as the solid-state imaging apparatus by way of example in the present embodiment. Needless to say, a CCD image sensor may be adopted. A specific example of the solid-state imaging apparatus that is the CMOS image sensor will be described hereinafter while referring to FIG. 19.

In FIG. 19, the solid-state imaging device 100 includes a pixel section 121, a vertical driving section 122, an AD conversion section 123, a reference signal generation section 124, a horizontal driving section 125, a communication/timing control section 126, and a signal processing section 127.

A plurality of pixels PXL each including a photodiode that serves as a photoelectric conversion section are disposed in a two-dimensional matrix in the pixel section 121. A color filter array having filters the colors of which are classified to correspond to the pixels is provided on a light-receiving surface of the pixel section 121. It is to be noted that a specific circuit configuration of the pixel PXL will be described later.

In the pixel section 121, n pixel driving lines HSLn (n=1, 2, . . . ) and m vertical signal lines VSLm (m=1, 2, . . . ) are arranged. The pixel driving lines HSLn are arranged along a transverse direction of FIG. 19 (pixel array direction of pixel rows/horizontal direction) and disposed equidistantly in a vertical direction of FIG. 19. The vertical signal lines VSLm are arranged along the vertical direction of FIG. 19 (pixel array direction of pixel columns/perpendicular direction) and disposed equidistantly in the transverse direction of FIG. 19.

One end of each pixel driving line HSLn is connected to an output terminal corresponding to each row of the vertical driving section 122. Each vertical signal line VSLm is connected to the pixels PXL in each column and one end thereof is connected to the AD conversion section 123. The vertical driving section 122 and the horizontal driving section 125 exercise control to sequentially read analog signals from the pixels PXL configuring the pixel section 121 under control of the communication/timing control section 126. It is to be noted that specific connection of the pixel driving line HSLn and the vertical signal line VSLm to each pixel PXL as well as the pixel PXL will be described later.

The communication/timing control section 126 includes, for example, a timing generator and a communication interface. The timing generator generates various clock signals on the basis of a clock (master clock) input from an outside. The communication interface receives data given from the outside of the solid-state imaging device 100 and associated with issuing a command of an operation mode, and outputs data containing internal information about the solid-state imaging device 100 to the outside.

The communication/timing control section 126 generates a clock at the same frequency as that of the master clock, a clock by frequency division of the clock by half, a low speed clock by further frequency division, and the like on the basis of the master clock, and supplies the clocks to the sections (vertical driving section 122, the horizontal driving section 125, the AD conversion section 123, the reference signal generation section 124, the signal processing section 127, and the like) in the solid-state imaging device.

The vertical driving section 122 is configured with, for example, a shift register and an address decoder. The vertical driving section 122 includes a vertical address setting section for controlling a row address on the basis of a signal obtained by decoding a video signal input from the outside and a row scanning control section for controlling row scanning.

The vertical driving section 122 can perform read scanning and sweep scanning. The read scanning is scanning for sequentially selecting unit pixels subjected to signal reading. The read scanning is basically performed sequentially in units of rows. In a case of thinning out pixels by summation or summation averaging of outputs from a plurality of pixels having a predetermined position relationship, the read scanning is performed in a predetermined order.

The sweep scanning is scanning for resetting unit pixels in a row or a combination of pixels subjected to reading ahead of this read scanning performed on the row or the combination of pixels subjected to reading by the read scanning by as much as time of a shutter speed.

The horizontal driving section 125 selects ADC circuits configuring the AD conversion section 123 in sequence synchronously with the clock output from the communication/timing control section 126. The AD conversion section 123 includes the ADC circuits (m=1, 2, . . . ) provided to correspond to the vertical signal lines VSLm, converts an analog signal output from each vertical signal line VSLm into a digital signal, and outputs the digital signal to a horizontal signal line Ltrf in accordance with control of the horizontal driving section 125.

The horizontal driving section 125 includes, for example, a horizontal address setting section and a horizontal scanning section. The horizontal address setting section 125 selects one of the ADC circuits, which corresponds to a column subjected to reading in the horizontal direction specified by the horizontal address setting section, in the AD conversion section 123, thereby introducing the digital signal generated by the selected ADC circuit to the horizontal signal line Ltrf.

The digital signal output from the AD conversion section 123 in this way is input to the signal processing section 127 via the horizontal signal line Ltrf. The signal processing section 127 performs a process for converting the signals output from the pixel section 121 by way of the AD conversion section 123 into image signals corresponding to a color arrangement of the color filter array using an arithmetic process.

Furthermore, the signal processing section 127 performs a process for thinning out pixel signals in the horizontal direction or the vertical direction by summation, summation averaging, or the like as needed. The image signals generated in this way are output to the outside of the solid-state imaging device 100.

The reference signal generation section 124 includes a digital analog converter (DAC), and generates a reference signal Vramp synchronously with a count clock supplied from the communication/timing control section 126. The reference signal Vramp is a sawtooth wave (ramp waveform) changing stepwise over time from an initial value supplied from the communication/timing control section 126. This reference signal Vramp is supplied to each of the ADC circuits in the AD conversion section 123.

The AD conversion section 123 includes the plurality of ADC circuits. In performing AD conversion on the analog signal output from each pixel PXL, each ADC circuit compares the reference signal Vramp with a voltage of the vertical signal line VSLm using a comparator in predetermined AD conversion periods (a P-phase period and a D-phase period to be described later), and counts time by a counter before or after inversion of a magnitude relationship between the reference signal Vramp and the voltage of the vertical signal line VSLm (pixel voltage). It is thereby possible to generate the digital signal in response to an analog pixel voltage. A specific example of the AD conversion section 123 will be described later.

Figure 20:
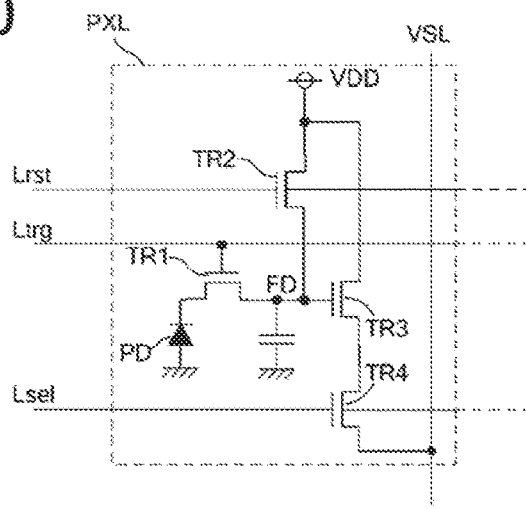
FIG. 20 is a view illustrating a circuit configuration of the pixel.

FIG. 20 is a view illustrating a circuit configuration of the pixel. FIG. 20 depicts an equivalent circuit to a pixel of an ordinary four-transistor scheme configuration. The pixel depicted in FIG. 20 includes a photodiode PD and four transistors (a transfer transistor TR1, a reset transistor TR2, an amplification transistor TR3, and a selection transistor TR4).

The photodiode PD generates a current in response to an amount of received light by photoelectric conversion. An anode of the photodiode PD is connected to a ground and a cathode thereof is connected to a drain of the transfer transistor TR1.

Various control signals are input to the pixel PXL from a reset signal generation circuit of the vertical driving section 122 and various drivers via signal lines Ltrg, Lrst, and Lsel.

The signal line Ltrg for transmitting a transfer gate signal is connected to a gate of the transfer transistor TR1. A source of the transfer transistor TR1 is connected to a connection point at which a source of the reset transistor TR2 is connected to a gate of the amplification transistor TR3. This connection point configures a floating diffusion FD that is a capacitor storing signal charges.

When a transfer signal is input to the gate of the transfer transistor TR1 through the signal line Ltrg, then the transfer transistor TR1 is turned on and transfers the signal charges (photoelectrons in this example) accumulated by the photoelectric conversion of the photodiode PD to the floating diffusion FD.

The signal line Lrst for transmitting a reset signal is connected to a gate of the reset transistor TR2 and a constant voltage source VDD is connected to a drain thereof. When the reset signal is input to the gate of the reset transistor TR2 through the signal line Lrst, the reset transistor TR2 is turned on and resets a voltage of the floating diffusion FD to a voltage of the constant voltage source VDD. On the other hand, in a case where the reset signal is not input to the gate of the reset transistor TR2 through the signal line Lrst, the reset transistor TR2 is turned off and forms a predetermined potential barrier between the floating diffusion FD and the constant voltage source VDD.

The amplification transistor TR3 configures a source follower such that the gate of the amplification transistor TR3 is connected to the floating diffusion FD, a drain thereof is connected to the constant voltage source VDD, and a source thereof is connected to a drain of the selection transistor TR4.

The signal line Lsel for a selection signal is connected to a gate of the selection transistor TR4 and a source thereof is connected to the vertical signal line VSLm. When a control signal (an address signal or a select signal) is input to the gate of the selection transistor TR4 through the signal line Lsel, the selection transistor TR4 is turned on. In a case where this control signal is not input to the gate of the selection transistor TR4, the selection transistor TR4 is turned off.

When the selection transistor TR4 is turned on, the amplification transistor TR3 amplifies the voltage of the floating diffusion FD and outputs the amplified voltage to the vertical signal line VSLm. The voltage output from each pixel through the vertical signal line VSLm is input to the AD conversion section 123.

It is to be noted that the circuit configuration of the pixel is not limited to the configuration depicted in FIG. 20 but any of various publicly known configurations such as a three-transistor scheme configuration and the other four-transistor scheme configuration can be adopted. Examples of the other four-transistor scheme configuration include a configuration such that the selection transistor TR4 is disposed between the amplification transistor TR3 and the constant voltage source VDD.

Figure 21:
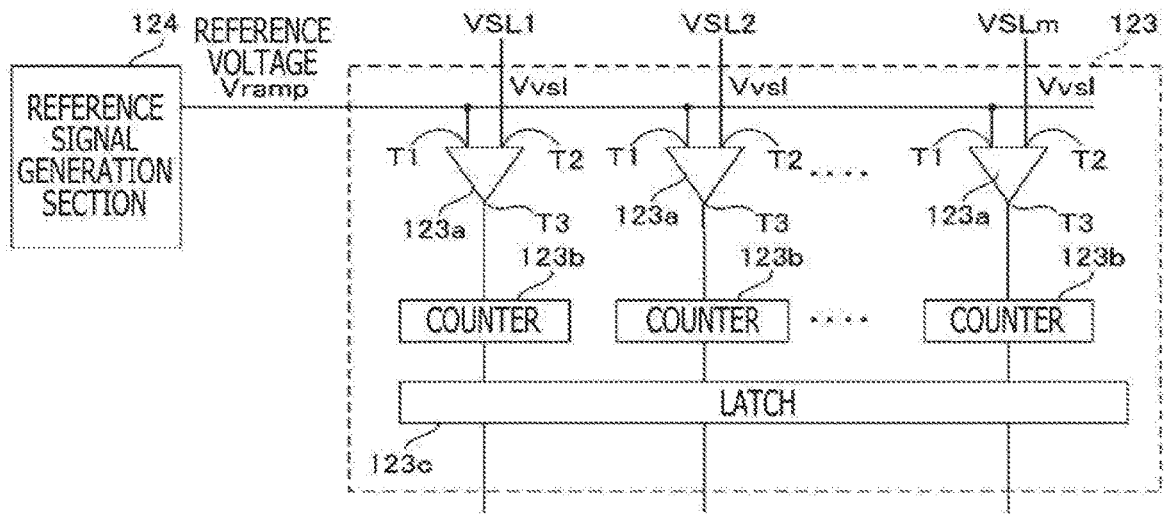
FIG. 21 is a view depicting a configuration of an AD conversion section.

FIG. 21 is a view depicting a configuration of the AD conversion section 123. As depicted in FIG. 21, each ADC circuit configuring the AD conversion section 123 includes a comparator 123a and a counter 123b provided per vertical signal line VSLm and a latch 123c.

The comparator 123a includes two input terminals T1 and T2 and one output terminal T3. The reference signal Vramp is input to one input terminal T1 from the reference signal generation section 124, while an analog pixel signal (hereinafter, referred to as "pixel signal Vvsl") output from each pixel through the vertical signal line VSLm is input to the other input terminal T2.

The comparator 123a compares the reference signal Vramp with the pixel signal Vvsl. The comparator 123a is designed to output a high level signal or a low level signal in response to a magnitude relationship between the reference signal Vramp and the pixel signal Vvsl, and an output from the output terminal T3 is inverted to the high level signal or to the low level signal with a switchover of the magnitude relationship between the reference signal Vramp and the pixel signal Vvsl.

The clock is supplied to the counter 123b from the communication/timing control section 126, and the counter 123b counts the time from start to end of the AD conversion using the clock. Timing of start of the AD conversion and that of end thereof are identified on the basis of a control signal (indicating, for example, whether a clock signal CLK is input) output from the communication/timing control section 126 and inversion of the output from the comparator 123a.

Furthermore, the counter 123b performs the ND conversion on the pixel signal by so-called correlated double sampling (CDS). Specifically, the counter 123b counts down the time while an analog signal corresponding to a reset component is output from the vertical signal line VSLm under control of the communication/timing control section 126. In addition, using a count value obtained by this countdown as an initial value, the counter 123b counts up the time while an analog signal corresponding to the pixel signal is output from the vertical signal line VSLm.

The count value generated in this way is a digital value corresponding to a difference between a signal component and the reset component. In other words, the count value is a value obtained by calibrating the digital value corresponding to the analog pixel signal input to the AD conversion section 123 from each pixel through the vertical signal line VSLm using the reset component.

The digital value generated by each counter 123b is stored in the latch 123c, sequentially output from the latch 123c in accordance with control of the horizontal scanning section, and output to the signal processing section 127 via the horizontal signal line Ltrf.

(B) Second Embodiment

FIGS. 22 to 33 are views each depicting an example of a method of manufacturing the solid-state imaging device. It is to be noted that a method of manufacturing the solid-state imaging device as the back irradiation type CMOS image sensor will be described by way of example in the present embodiment similarly to the first embodiment.

Figure 22:
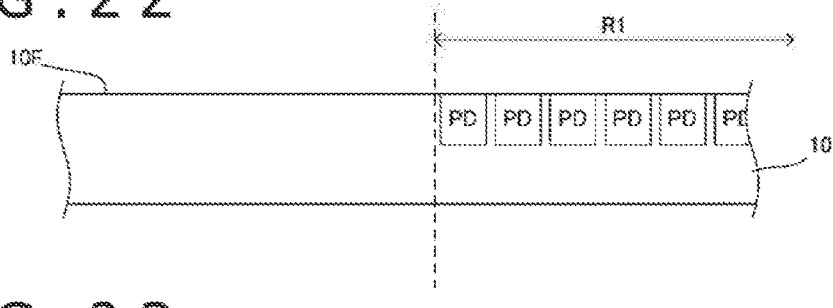
FIG. 22 is a view depicting an example of a method of manufacturing the solid-state imaging device.

First, as depicted in FIG. 22, constituent elements of a plurality of unit pixels (STI, photodiodes PD, source regions/drain regions of pixel transistors, and the like) are formed in the imaging device region R1 of the semiconductor substrate 10 from the front surface 10F side of the semiconductor substrate 10 in a two-dimensional array and in a two-dimensional matrix by, for example, ion implantation. It is to be noted that FIG. 22 exemplarily depicts only the photodiodes PD. A gate electrode is stacked on each unit pixel via a gate insulation film.

Figure 23:
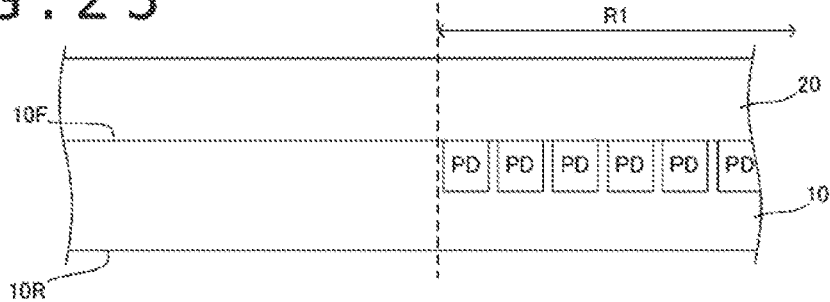
FIG. 23 is a view depicting an example of the method of manufacturing the solid-state imaging device.

Next, as depicted in FIG. 23, the interconnection layer 20 in which interconnections of a plurality of layers are disposed is stacked on the front surface 10F of the semiconductor substrate 10 via an interlayer insulation film. The peripheral circuits such as a logical circuit are formed on the interconnection layer 20 formed on the outside of the imaging device region R1. An interlayer insulation film such as an $SiO_2$ film is stacked on an uppermost surface of the interconnection layer 20, and the surface of the interconnection layer 20 is formed into a generally planarized surface by planarizing this interlayer insulation film by chemical mechanical polishing (CMP).

Figure 24:
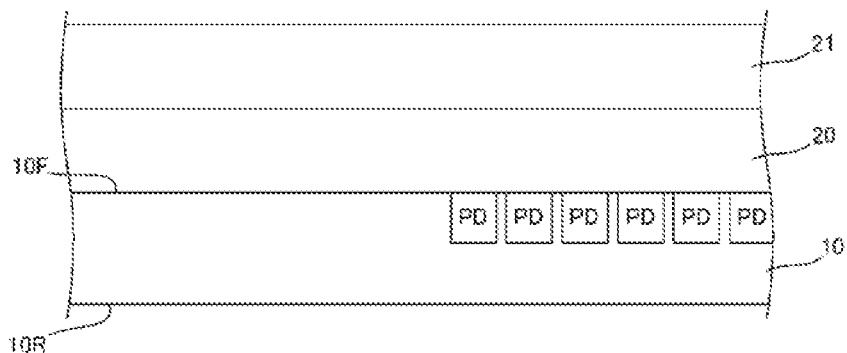
FIG. 24 is a view depicting an example of the method of manufacturing the solid-state imaging device.

As depicted in FIG. 24, a supporting substrate 21 is bonded onto the generally planarized surface that is the uppermost surface of the interconnection layer 20 to reinforce the interconnection layer 20. For example, a semiconductor substrate of bulk silicon is used as the supporting substrate 21. It is to be noted that in a case of forming part of or all of the peripheral circuits on a peripheral circuit substrate manufactured separately, the peripheral circuit substrate is bonded onto the surface of the interconnection layer 20 and the supporting substrate 21 is bonded onto this peripheral circuit substrate.

Figure 25:
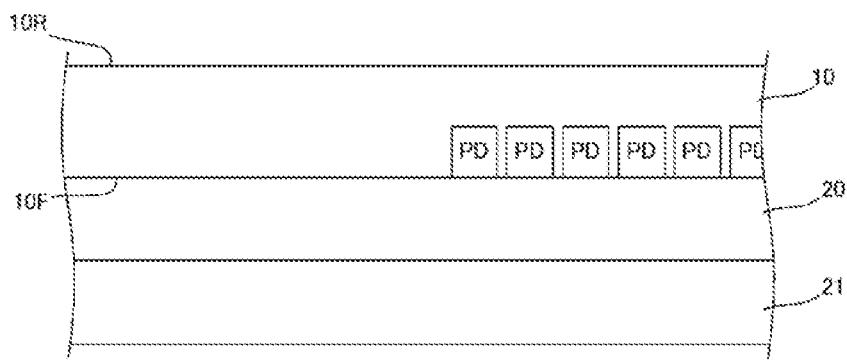
FIG. 25 is a view depicting an example of the method of manufacturing the solid-state imaging device.

Next, as depicted in FIG. 25, the semiconductor substrate 10 onto which the supporting substrate 21 is bonded is turned inside out and the rear surface 10R of the semiconductor substrate 10 serves as an upper surface.

Figure 26:
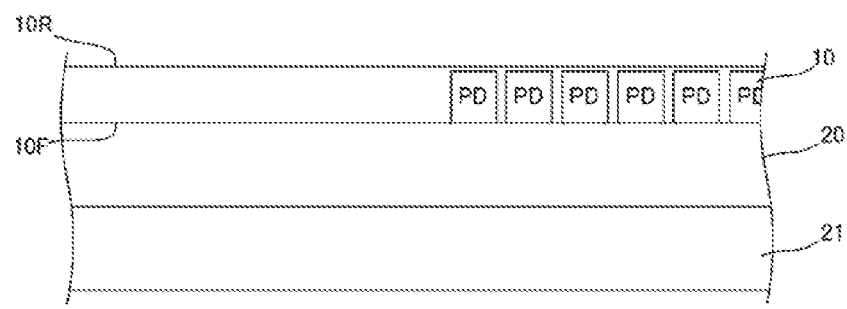
FIG. 26 is a view depicting an example of the method of manufacturing the solid-state imaging device.

Next, as depicted in FIG. 26, removal machining is performed on the rear surface 10R of the semiconductor substrate 10 to neighborhoods of rear surfaces of the photodiodes PD by grinding and polishing, as needed. Finally, the rear surface 10R of the semiconductor substrate 10 is machined into a generally planarized surface by the CMP. It is to be noted that the final machining can be performed by etching.

Figure 27:
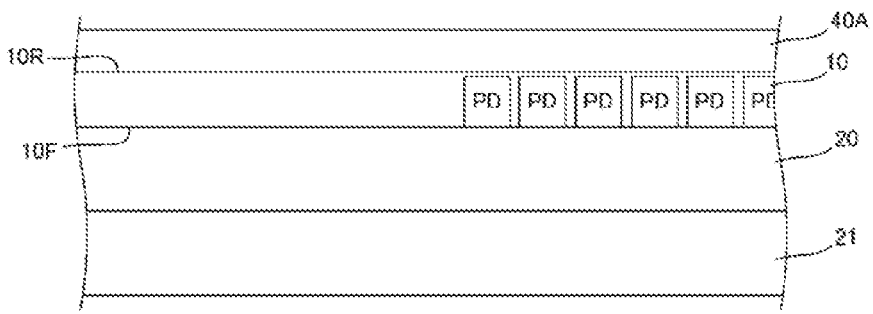
FIG. 27 is a view depicting an example of the method of manufacturing the solid-state imaging device.

Next, as depicted in FIG. 27, a high refractive index material for application is applied to form a high refractive index layer 40A. For example, a siloxane-based material that contains transparent metal oxide film fine particles such as $TiO_x$ or $ZnO_x$ can be used as the high refractive index material for application. A refractive index of the high refractive index material is higher than 1.4 to 1.6 that is the refractive index of the material normally used as optical paths and preferably equal to or higher than 1.8. For example, spin coating is used for forming the high refractive index layer 40A and an optimum thickness is selected as a thickness of the high refractive index layer 40A depending on the height of the in-layer lenses 41 and the structures 42.

Figure 28:
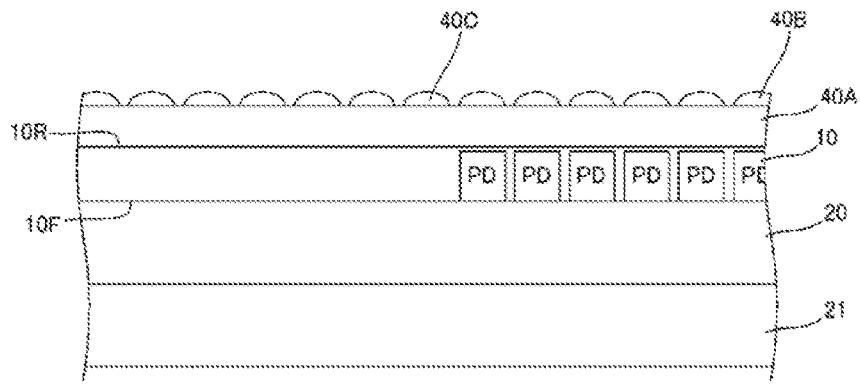
FIG. 28 is a view depicting an example of the method of manufacturing the solid-state imaging device.
Figure 29:
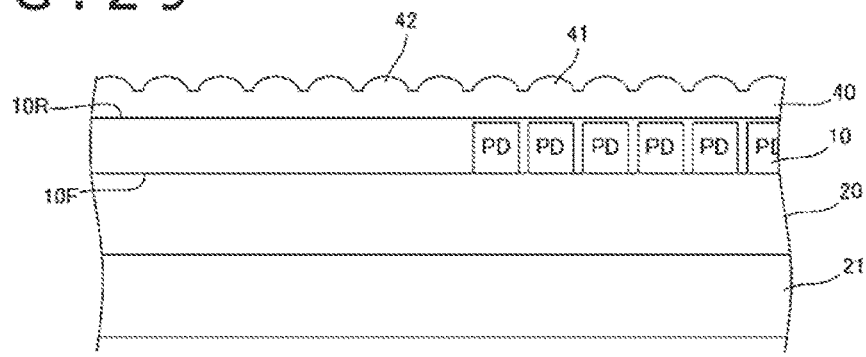
FIG. 29 is a view depicting an example of the method of manufacturing the solid-state imaging device.

Next, as depicted in FIG. 28, a resist for forming the in-layer lenses 41 and the structures 42 is formed on the high refractive index layer 40A. After the resist is formed, a lens pattern is formed by lithography and a heat treatment (reflow) is carried out, thereby forming knoll-shaped resists 40B in formation sites of the in-layer lenses 41 and forming resists 40C of a shape (a rectangular hilly projection shape in FIG. 28) depending on the shape of the structures 42 in formation sites of the structures 42, as depicted in FIG. 28. Subsequently, overall etch-back is performed by dry etching and the shapes of the resists 40B and 40C are transferred onto the high refractive index layer 40A, thereby forming the in-layer lens layer 40 as depicted in FIG. 29. It is to be noted that examples of types of etching gas used for etching include fluorocarbon gas such as $CF_4$ and $C_4F_8$ and $O_2$.

Figure 30:
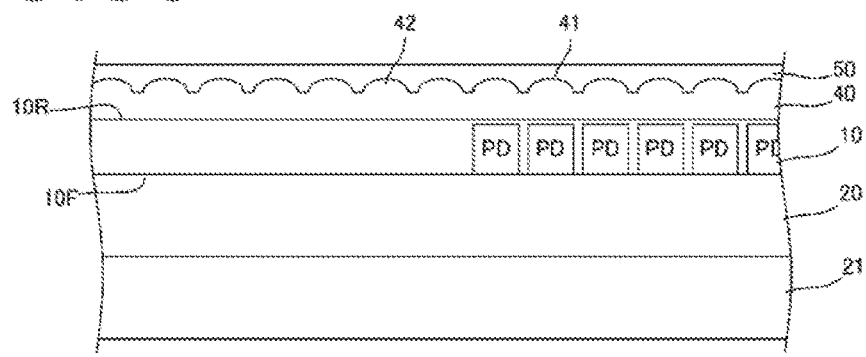
FIG. 30 is a view depicting an example of the method of manufacturing the solid-state imaging device.

Next, as depicted in FIG. 30, the transparent planarization layer 50 is formed on the in-layer lens layer 40. The planarization layer 50 is formed by stacking $SiO_2$ by, for example, a plasma CVD method. Since an $SiO_2$ film formed by the CVD conforms to a step of a based material to be formed, the formed $SiO_2$ film has a surface shape reflective of the irregular shape of the in-layer lens layer 40. Furthermore, the planarization layer 50 may be formed by forming a thermoplastic resin film by a spin coating method and then performing a thermosetting treatment. The $SiO_2$ film formed by the spin coating method and having the surface shape reflective of the irregular shape of the in-layer lens layer 40 to some extent is formed. Planarizing the $SiO_2$ film formed in this way by chemical mechanical polishing enables formation of the planarization layer 50 having the generally planarized surface. At this time, the projections as the in-layer lenses 41 and the structures 42 are formed generally entirely on the in-layer lens layer 40; thus, there is no large step near the boundary between the imaging device region R1 and the other regions in the surface shape of the $SiO_2$ film, and a step that could influence yield does not remain near the boundary.

Figure 31:
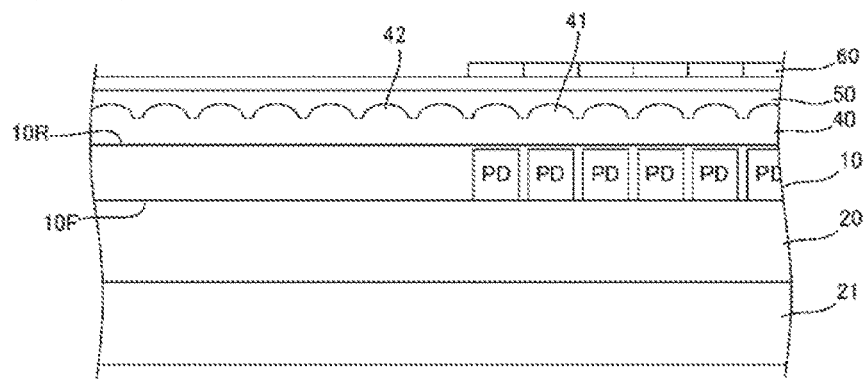
FIG. 31 is a view depicting an example of the method of manufacturing the solid-state imaging device.

Next, as depicted in FIG. 31, the color filter layer 60 is formed on the planarization layer 50. Examples of the color filter layer 60 include a color filter layer in which filters of primary colors of green, red, and blue are arranged in a Bayer array. The color filters of the color filter layer 60 are not limited to those of the three primary colors of light described above and color filters of complementary colors may be used or a combination of the color filters and white color filters can be used as the color filters. An additional planarization layer may be provided on an upper surface of the color filter layer 60 as needed.

Figure 32:
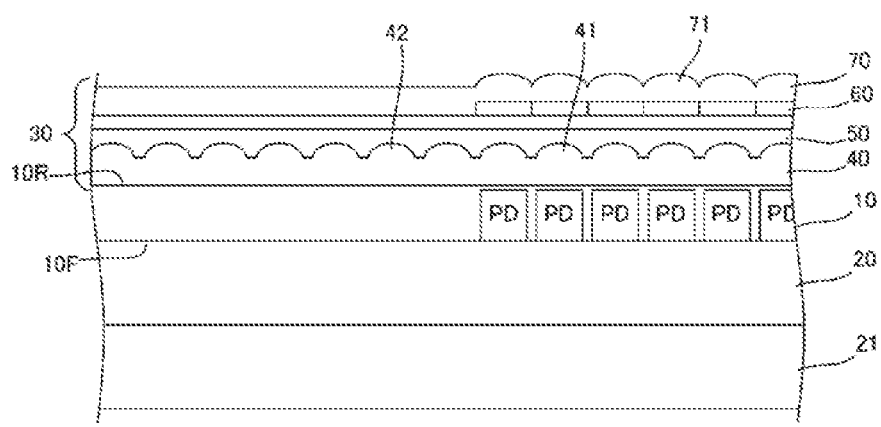
FIG. 32 is a view depicting an example of the method of manufacturing the solid-state imaging device.

Next, as depicted in FIG. 32, the on-chip lens layer 70 is formed on the color filter layer 60. The on-chip lens layer 70 is formed by, for example, forming a positive photoresist film on the color filter layer 60 and processing the positive photoresist film by the photolithography.

Figure 33:
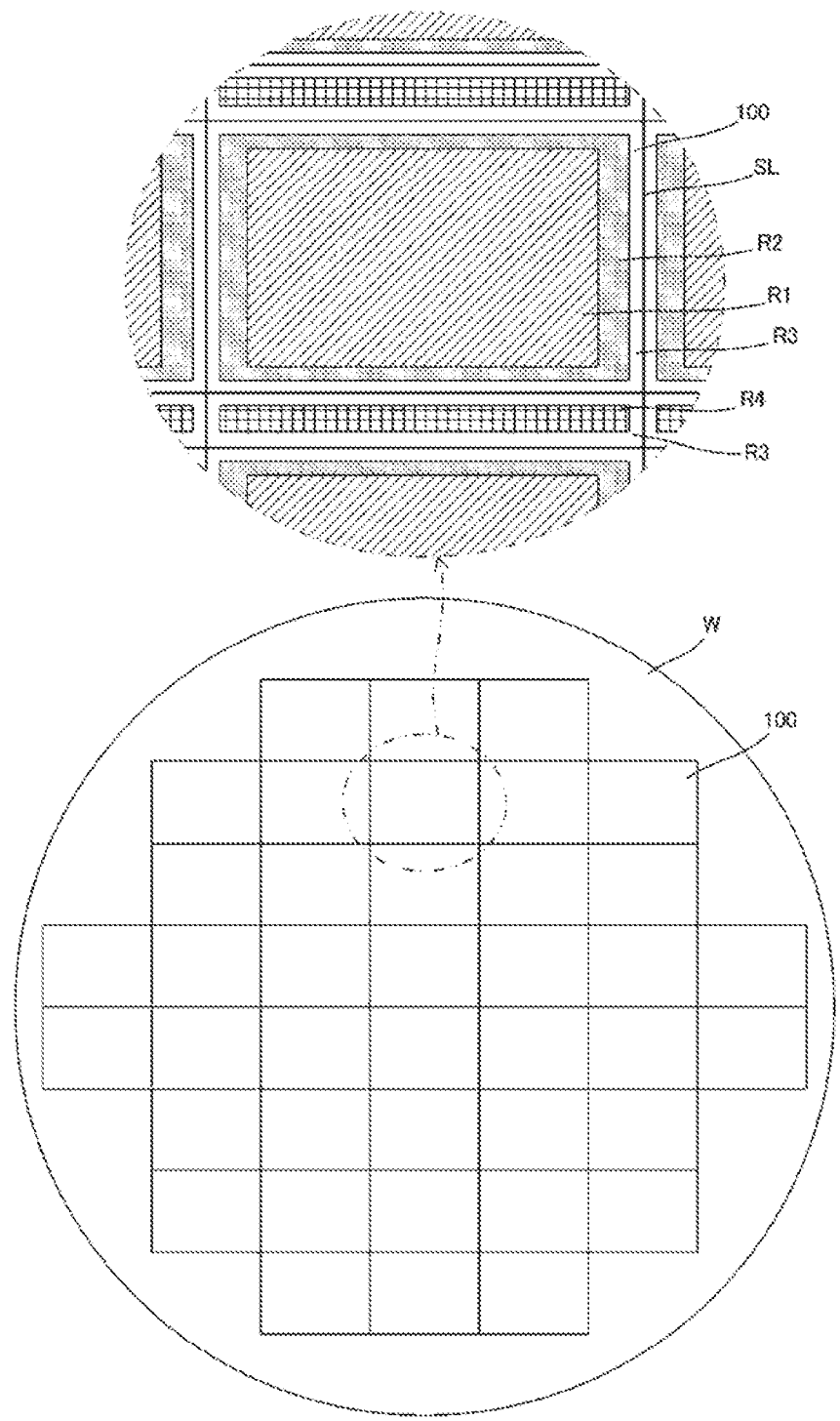
FIG. 33 is a view depicting an example of the method of manufacturing the solid-state imaging device.

Through the processes described above, a work substrate W on which a plurality of solid-state imaging devices 100 are formed is produced as depicted in FIG. 33. Scribe lines SL for dividing the work substrate 100 into the solid-state imaging devices 100 by dicing are formed lengthwise and crosswise, and the imaging device region R1 and the peripheral circuit region R2 within a rectangular region surrounded by the scribe lines SL and a partially frame-shaped region of the scribe region R3 surrounding the imaging device region R1 and the peripheral circuit region R2 are divided as each solid-state imaging device 100. It is to be noted that the scribe region R3 within the rectangular region surrounded by the scribe lines SL often contains a TEG region R4 separated and divided from the solid-state imaging device 100. In this case, the structures 42 similar to those in the peripheral circuit region R2 are also formed on the in-layer lens layer 40 in the TEG region R4. By the manufacturing method described above, the solid-state imaging device 100 according to the first embodiment described above can be manufactured.

(C) Third Embodiment

Figure 34:
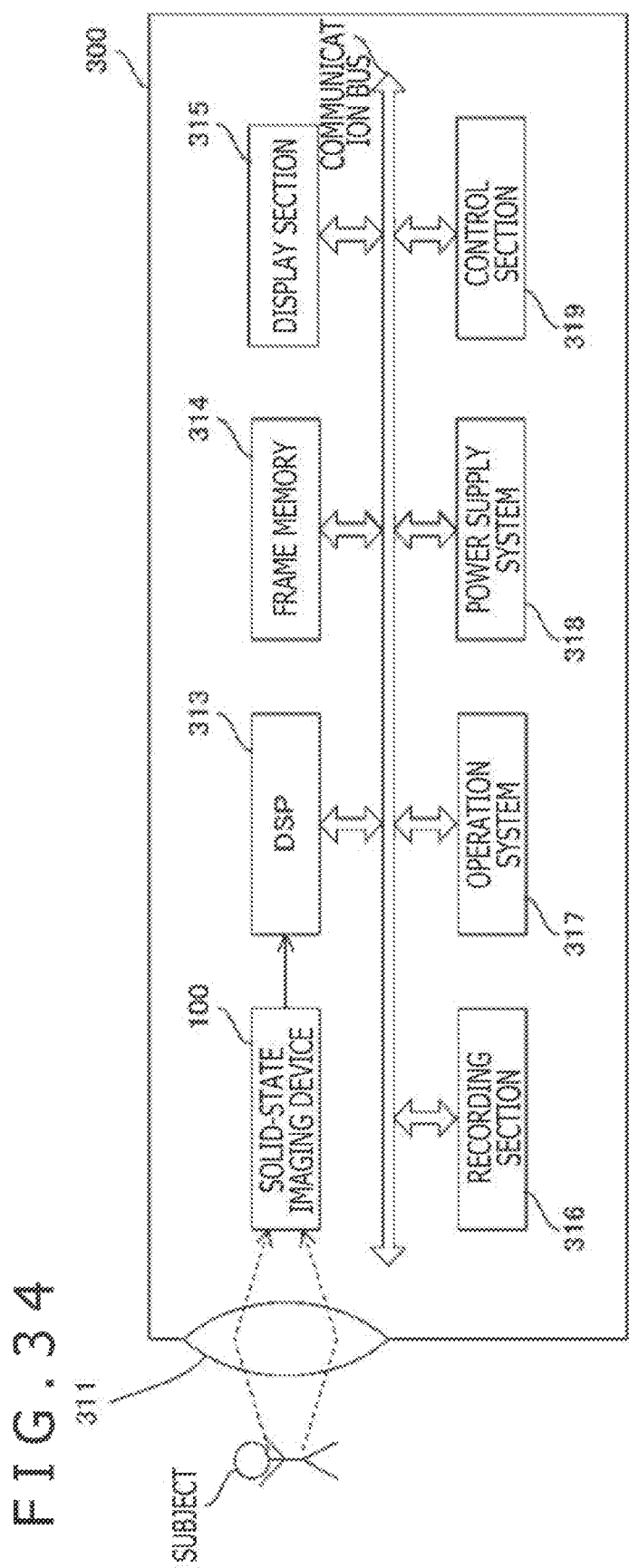
FIG. 34 is a block diagram depicting a configuration of an imaging apparatus including the solid-state imaging device.

FIG. 34 is a block diagram depicting a configuration of an imaging apparatus 300 including the solid-state imaging device 100. The imaging apparatus 300 depicted in FIG. 34 is an example of an electronic apparatus.

It is to be noted that the imaging apparatus refers to any of entire electronic apparatuses using the solid-state imaging device in an image capture section (photoelectric conversion section) such as imaging apparatuses including a digital still camera and a digital video camera and mobile terminal apparatuses including a mobile telephone having an imaging function. Needless to say, examples of the electronic apparatus using the solid-state imaging device in the image capture section include a copying machine using the solid-state imaging device in an image read section. Furthermore, the imaging apparatus including the solid-state imaging device may be modularized so that the imaging apparatus is mounted in the electronic apparatus described above.

In FIG. 34, the imaging apparatus 300 includes an optical system 311 including a lens group, the solid-state imaging device 100, a digital signal processor (DSP) 313 that serves as a signal processing circuit which processes an output signal from the solid-state imaging device 100, a frame memory 314, a display section 315, a recording section 316, an operation system 317, a power supply system 318, and a control section 319.

The DSP 313, the frame memory 314, the display section 315, the recording section 316, the operation system 317, the power supply section 318, and the control section 319 are connected via a communication bus so that the frame memory 314, the display section 315, the recording section 316, the operation system 317, the power supply section 318, and the control section 319 can mutually transmit and receive data and signals.

The optical system 311 captures incident light (image light) from a subject and forms an image on an imaging surface of the solid-state imaging device 100. The solid-state imaging device 100 generates an electrical signal in response to an amount of the received incident light imaged on the imaging surface by the optical system 311 per pixel and outputs the electrical signal as a pixel signal. This pixel signal is input to the DSP 313, and image data generated by performing various image processes on the pixel signal as appropriate is stored in the frame memory 314, recorded in a recording medium of the recording section 316, or output to the display section 315.

The display section 315 is configured with a panel type display device such as a liquid crystal display device or an organic electro luminescence (EL) display device, and displays a moving image and a still image captured by the solid-state imaging device 100 and other information. The recording section 316 records the moving image and the still image captured by the solid-state imaging device 100 in a recording medium such as a digital versatile disk (DVD), a hard disk (HD), or a semiconductor memory.

The operation system 317 receives various operations from a user and transmits operation commands in response to the user's operations to the sections 313, 314, 315, 316, 318, and 319 via the communication bus. The power supply system 318 generates various power supply voltages that act as driving power and supplies the generated power supply voltages to objects to be supplied (the sections 312, 313, 314, 315, 316, 317, and 319) as appropriate.

The control section 319 includes a CPU that performs an arithmetic process, a ROM that stores a control program for the imaging apparatus 300, a RAM that functions as a work area of the CPU, and the like. The control section 319 controls the sections 313, 314, 315, 316, 317, and 318 by causing the CPU to execute the control program stored in the ROM while using the RAM as the work area. Furthermore, the control section 319 controls the timing generator, which is not depicted, to generate various timing signals, and exercises control to supply the timing signals to the sections.

(D) Example of Application to Endoscopic Surgery System

The technology according to the present disclosure can be applied to various products. For example, the technology according to the present disclosure may be applied to an endoscopic surgery system.

Figure 35:
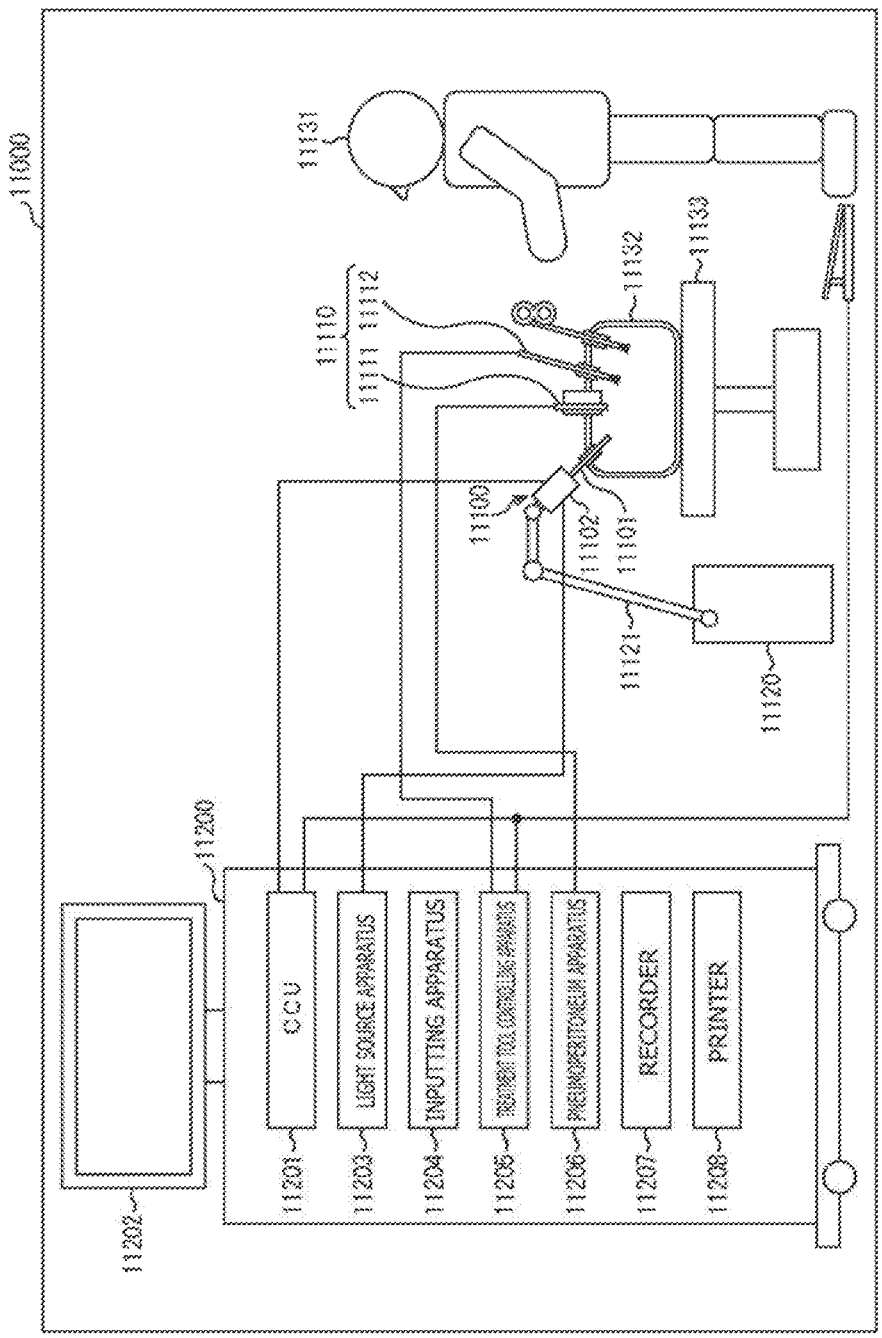
FIG. 35 is a view depicting an example of a schematic configuration of an endoscopic surgery system.

FIG. 35 is a view depicting an example of a schematic configuration of an endoscopic surgery system to which the technology according to an embodiment of the present disclosure (present technology) can be applied.

In FIG. 35, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 36:
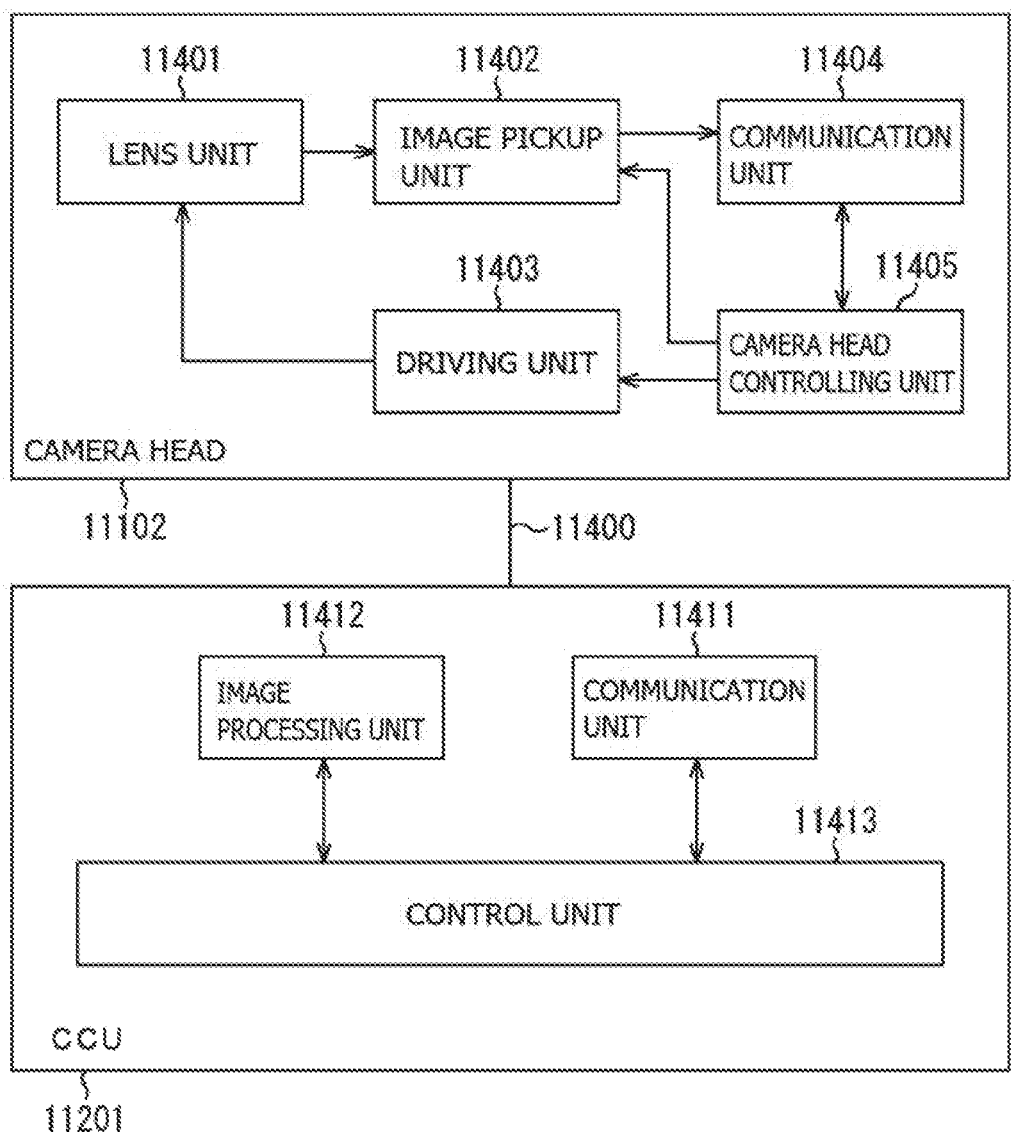
FIG. 36 is a block diagram depicting an example of a functional configuration of a camera head and a camera control unit (CCU).

FIG. 36 is a block diagram depicting an example of a functional configuration of the camera head 11102 and the CCU 11201 depicted in FIG. 35.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the image pickup unit 11402 of the camera head 11102 among the configurations described above. Specifically, the solid-state imaging device 100 of FIG. 1 can be applied to the image pickup unit 10402. Applying the technology according to the present disclosure to the image pickup unit 10402 makes it possible to suppress occurrence of a variation in light condensing characteristics among the on-chip lenses resulting from providing the in-layer lenses while preventing the deterioration of the device characteristics and the reduction of yield. Since a clearer surgical region image can be obtained, the surgeon can confirm the surgical region with certainty.

While the endoscopic surgery system has been described herein as an example, the technology according to the present disclosure may be applied to the other system, for example, a microscopic surgery system.

(E) Example of Application to Mobile Body

The technology according to the present disclosure can be applied to various products. For example, the technology according to the present disclosure may be implemented as a device mounted in a mobile body of any of kinds such as a vehicle, an electric-powered vehicle, a hybrid electric-powered vehicle, a two-wheeled vehicle, a bicycle, a personal mobility, an airplane, a drone, a ship, and a robot.

Figure 37:
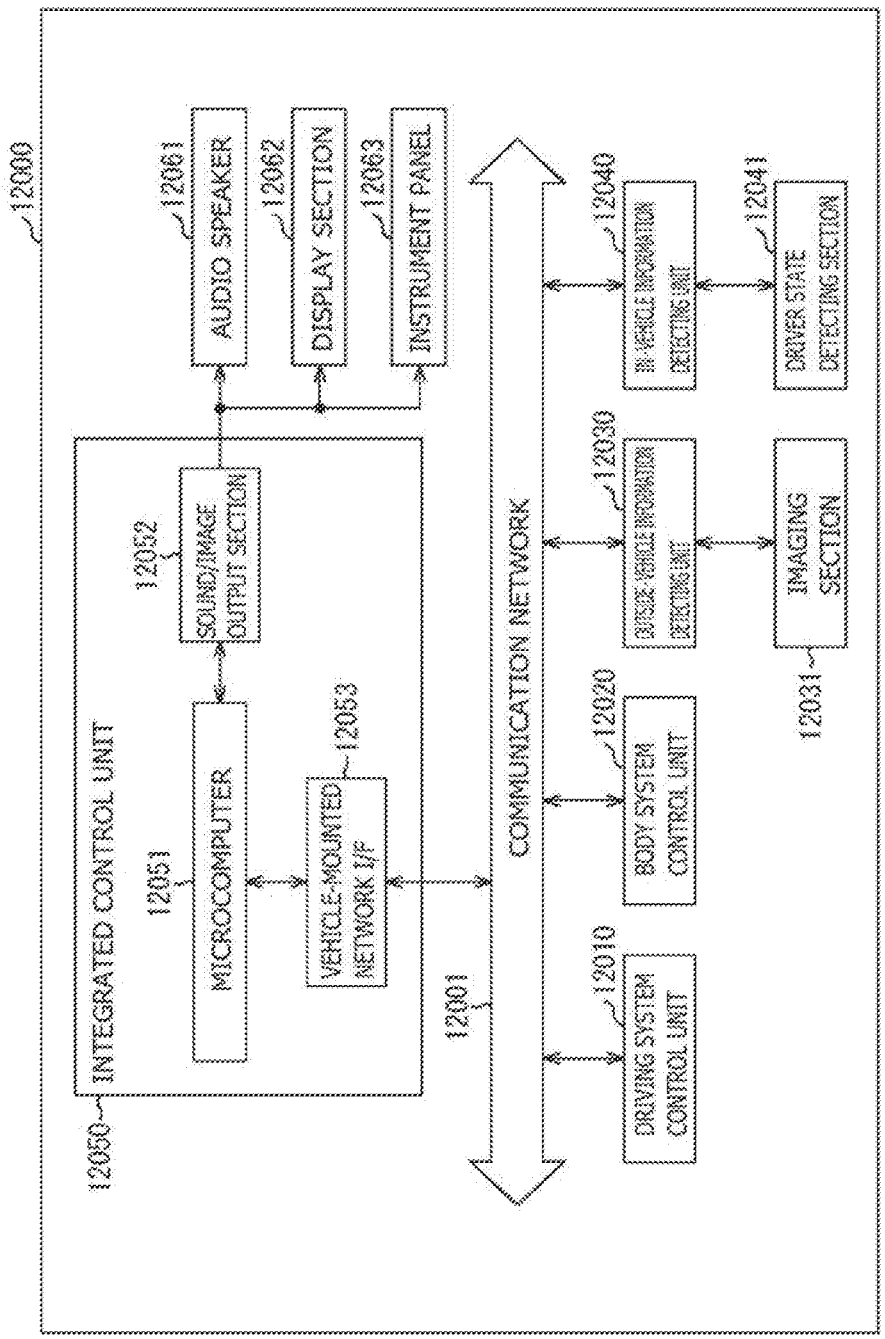
FIG. 37 is a block diagram depicting an example of schematic configuration of a vehicle control system.

FIG. 37 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 37, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 37, an audio speaker 12061, a display section 12062, and an instrument panel 12063 are illustrated as the output device. The display section 12062 may, for example, include at least one of an on-board display and a head-up display.

Figure 38:
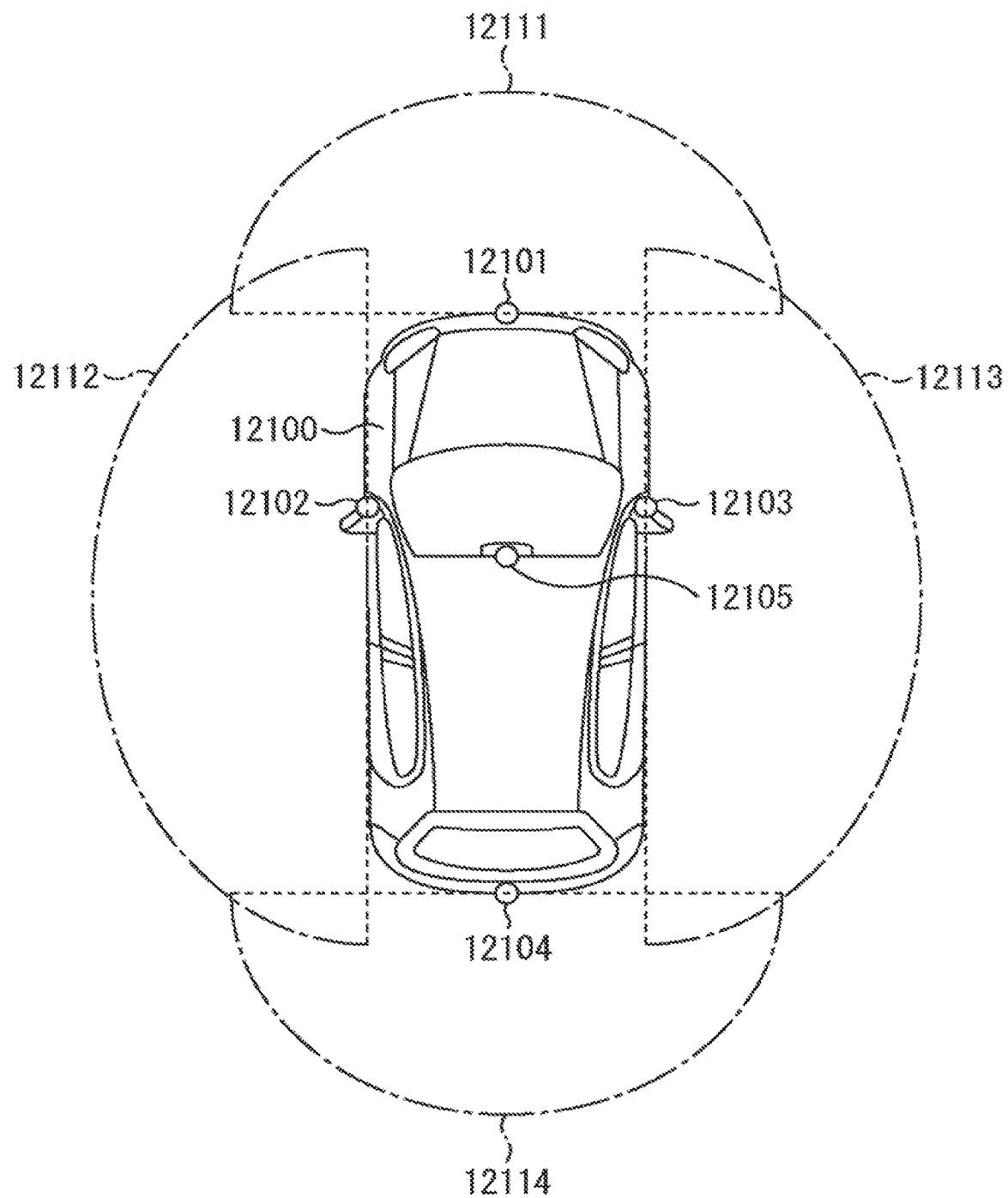
FIG. 38 is a diagram of assistance in explaining an example of installation positions of an outside-vehicle information detecting section and an imaging section.

FIG. 38 is a diagram depicting an example of the installation position of the imaging section 12031.

In FIG. 38, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Incidentally, FIG. 38 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 or the like among the configurations described above. Specifically, the solid-state imaging device 100 of FIG. 1 can be applied to the imaging section 12031 or the like. Applying the technology according to the present disclosure to the imaging section 12031 makes it possible to suppress occurrence of a variation in light condensing characteristics among the on-chip lenses resulting from providing the in-layer lenses while preventing the deterioration of the device characteristics and the reduction of yield. Since a captured image easier to see can be obtained, it is possible to lessen driver's fatigue.

It is to be noted that the present technology is not limited to the embodiments described above but include a configuration such that the configurations disclosed in the above embodiments are mutually replaced or that a combination of the configurations is changed, a configuration such that the configurations disclosed in the well-known technologies and in the above embodiments are mutually replaced or that a combination of the configurations is changed, and the like. Furthermore, a technical scope of the present technology is not limited to the embodiments described above but encompasses matters set forth in claims and equivalents therefor. Furthermore, the present technology can be configured as follows.

(1) A solid-state imaging device including:
a semiconductor substrate on which a plurality of photoelectric conversion devices are arranged in an imaging device region in a two-dimensional array; and
a stacked body formed by stacking a plurality of layers on the semiconductor substrate, in which
the stacked body includes an in-layer lens layer that has in-layer lenses each provided at a position corresponding to each of the photoelectric conversion devices; a planarization layer that is stacked on the in-layer lens layer and that has a generally planarized surface; and an on-chip lens layer that is an upper layer than the planarization layer and that has on-chip lenses each provided at a position corresponding to each of the photoelectric conversion devices, and
the in-layer lens layer has a plurality of structures at a height generally equal to a height of the in-layer lenses, the plurality of structures being provided on an outside of the imaging device region.

(2) The solid-state imaging device according to (1) or (2), in which the structures are provided generally entirely on the outside of the imaging device region.

(3) The solid-state imaging device according to any one of (1) and (2), in which the structures are not provided in a site where a positioning mark is provided on a lower layer than the in-layer lens layer.

(4) The solid-state imaging device according to any one of (1) to (3), in which the structures are provided at positions at which cross-sections of the structures do not appear on a scribed section of the solid-state imaging device.

(5) The solid-state imaging device according to any one of (1) to (4), in which the structures are generally identical in shape to the in-layer lens.

(6) The solid-state imaging device according to any one of (1) to (5), in which the structures differ in shape from the in-layer lens.

(7) The solid-state imaging device according to any one of (1) to (6), in which the structures are provided at pitches generally equivalent to pitches of the in-layer lenses in the in-layer lens layer.

(8) The solid-state imaging device according to any one of (1) to (6), in which the structures are provided at pitches different from pitches of the in-layer lenses in the in-layer lens layer.

(9) An imaging apparatus including: a solid-state imaging device; and a signal processing circuit that processes a signal from the solid-state imaging device, in which the solid-state imaging device includes a semiconductor substrate on which a plurality of photoelectric conversion devices are arranged in an imaging device region in a two-dimensional array; and a stacked body formed by stacking a plurality of layers on the semiconductor substrate,
the stacked body includes an in-layer lens layer that has in-layer lenses each provided at a position corresponding to each of the photoelectric conversion devices; a planarization layer that is stacked on the in-layer lens layer and that has a generally planarized surface; and an on-chip lens layer that is an upper layer than the planarization layer and that has on-chip lenses each provided at a position corresponding to each of the photoelectric conversion devices, and
the in-layer lens layer has a plurality of structures at a height generally equal to a height of the in-layer lenses, the plurality of structures being provided on an outside of the imaging device region.

(10) A method of manufacturing a solid-state imaging device, including:
a first step of forming a plurality of photoelectric conversion devices in an imaging device region of a semiconductor substrate in a two-dimensional array; and
a second step of forming a plurality of layers by stacking on another on the semiconductor substrate, in which
the second step includes: a step of forming an in-layer lens layer that has in-layer lenses each at a position corresponding to each of the photoelectric conversion devices; a step of forming a planarization layer having a generally planarized surface on the in-layer lens layer; and a step of forming an on-chip lens layer that is an upper layer than the planarization layer and that has on-chip lenses each at a position corresponding to each of the photoelectric conversion devices, and
in the step of forming the in-layer lens layer, a plurality of structures at a height generally equal to a height of the in-layer lenses are formed on an outside of the imaging device region.

REFERENCE SIGNS LIST

10 . . . Semiconductor substrate, 10F . . . Front surface, 10R . . . Rear surface, 11 . . . Unit pixel, 20 . . .

Interconnection layer, 21 . . . Supporting substrate, 30 . . . Stacked body, 40 . . . In-layer lens layer, 40A . . . High refractive index layer, 40B . . . Resist, 40C . . . Resist, 41 . . . In-layer lens, 42 . . . Structure, 50 . . . Planarization layer, 60 . . . Color filter layer, 61 . . . Color filter, 70 . . . On-chip lens layer, 71 . . . On-chip lens, 100 . . . Solid-state imaging device, 121 . . . Pixel section, 122 . . . Vertical driving section, 123 . . . Analog-digital conversion section (AD conversion section), 123a . . . Comparator, 123b . . . Counter, 123c . . . Latch, 124 . . . Reference signal generation section, 125 . . . Horizontal driving section, 126 . . . Timing control section, 127 . . . Signal processing section, 300 . . . Imaging apparatus, 311 . . . Optical system, 313 . . . DSP, 314 . . . Frame memory, 315 . . . Display section, 316 . . . Recording section, 317 . . . Operation system, 318 . . . Power supply system, 319 . . . Control section, 11402 . . . Image pickup unit, 12031 . . . Imaging section, 12101 to 12105 . . . Imaging section, FD . . . Floating diffusion, HSLn . . . Pixel driving line, Lrst . . . Signal line, Lsel . . . Signal line, Ltrf . . . Horizontal signal line, Ltrg . . . Signal line, M . . . Positioning mark, PD Photodiode, PXL . . . Pixel, R1 . . . Imaging device region, R2 . . . Peripheral circuit region, R3 . . . Scribe region, R4 . . . TEG region, SL . . . Scribe line, T1 . . . Input terminal, T2 . . . Input terminal, T3 . . . Output terminal, TR1 . . . Transfer transistor, TR2 . . . Reset transistor, TR3 . . . Amplification transistor, TR4 . . . Selection transistor, VSLm . . . Vertical signal line, W . . . Work substrate

The invention claimed is:

1. A light detecting device, comprising:
a semiconductor substrate on which a plurality of photoelectric conversion devices is arranged in an imaging device region in a two-dimensional array; and
a stacked body comprising a plurality of layers stacked on the semiconductor substrate, wherein
the plurality of layers comprises:
an in-layer lens layer that comprises a plurality of in-layer lenses and a plurality of structures, wherein
each in-layer lens of the plurality of in-layer lenses is at a first position corresponding to each photoelectric conversion device of the plurality of photoelectric conversion devices,
the plurality of structures is at a height equal to a height of the plurality of in-layer lenses, and
the plurality of structures is on an outside of the imaging device region;
a planarization layer that is stacked on the in-layer lens layer and that has a planarized surface; and
an on-chip lens layer that is an upper layer than the planarization layer and that comprises a plurality of on-chip lenses,
each on-chip lens of the plurality of on-chip lenses is at a second position corresponding to each photoelectric conversion device of the plurality of photoelectric conversion devices, and
in a plan view, a first region in which the plurality of on-chip lenses is provided is smaller than a second region in which the plurality of in-layer lenses and the plurality of structures are provided.

2. The light detecting device according to claim 1, wherein, in the plan view, the first region is equal to the imaging device region.

3. The light detecting device according to claim 1, wherein the plurality of structures is not provided in a site where a positioning mark is provided on a lower layer than the in-layer lens layer.

4. The light detecting device according to claim 1, wherein the plurality of structures is at positions at which cross-sections of the plurality of structures do not appear on a scribed section of the light detecting device.

5. The light detecting device according to claim 1, wherein a shape of a structure of the plurality of structures is identical to a shape of an in-layer lens of the plurality of in-layer lenses.

6. The light detecting device according to claim 1, wherein a shape of a structure of the plurality of structures is different from a shape of an in-layer lens of the plurality of in-layer lenses.

7. The light detecting device according to claim 1, wherein a plurality of pitches of the plurality of structures is equivalent to a plurality of pitches of the plurality of in-layer lenses in the in-layer lens layer.

8. The light detecting device according to claim 1, wherein a plurality of pitches of the plurality of structures is different from a plurality of pitches of the plurality of in-layer lenses in the in-layer lens layer.

9. An imaging apparatus, comprising:
a light detecting device; and
a signal processing circuit configured to process a signal from the light detecting device, wherein
the light detecting device includes:
a semiconductor substrate on which a plurality of photoelectric conversion devices is arranged in an imaging device region in a two-dimensional array; and
a stacked body comprising a plurality of layers stacked on the semiconductor substrate,
the plurality of layers includes:
an in-layer lens layer that comprises a plurality of in-layer lenses and a plurality of structures, wherein
each in-layer lens of the plurality of in-layer lenses is at a first position corresponding to each photoelectric conversion device of the plurality of photoelectric conversion devices,
the plurality of structures is at a height equal to a height of the plurality of in-layer lenses, and
the plurality of structures is on an outside of the imaging device region;
a planarization layer that is stacked on the in-layer lens layer and that has a planarized surface; and
an on-chip lens layer that is an upper layer than the planarization layer and that comprises a plurality of on-chip lenses,
each on-chip lens of the plurality of on-chip lenses is at a second position corresponding to each photoelectric conversion device of the plurality of photoelectric conversion devices, and
in a plan view, a first region in which the plurality of on-chip lenses is provided is smaller than a second region in which the plurality of in-layer lenses and the plurality of structures are provided.

10. A method of manufacturing a light detecting device, comprising:
forming a plurality of photoelectric conversion devices in an imaging device region of a semiconductor substrate in a two-dimensional array; and
forming a stacked body by stacking a plurality of layers on the semiconductor substrate, wherein the forming of the stacked body includes:
- forming an in-layer lens layer that comprises a plurality of in-layer lenses and a plurality of structures, wherein
  - each in-layer lens of the plurality of in-layer lenses is at a first position corresponding to each photoelectric conversion device of the plurality of photoelectric conversion devices,
  - the plurality of structures is at a height equal to a height of the plurality of in-layer lenses, and
  - the plurality of structures is on an outside of the imaging device region;
- forming a planarization layer having a planarized surface, on the in-layer lens layer; and
- forming an on-chip lens layer that is an upper layer than the planarization layer and that comprises a plurality of on-chip lenses, each on-chip lens of the plurality of on-chip lenses is at a second position corresponding to each photoelectric conversion device of the plurality of photoelectric conversion devices, and in a plan view, a first region in which the plurality of on-chip lenses is provided is smaller than a second region in which the plurality of in-layer lenses and the plurality of structures are provided.

\* \* \* \* \*